(12) United States Patent
Moriya et al.

(10) Patent No.: US 7,134,196 B2
(45) Date of Patent: Nov. 14, 2006

(54) ELECTRONIC DEVICE AND MANUFACTURING SAME

(75) Inventors: Bunji Moriya, Tokyo (JP); Seiichi Tajima, Tokyo (JP); Fumikachi Kurosawa, Tokyo (JP); Shinichiro Hayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 296 days.

(21) Appl. No.: 10/812,017

(22) Filed: Mar. 30, 2004

(65) Prior Publication Data

US 2004/0177498 A1    Sep. 16, 2004

Related U.S. Application Data

(62) Division of application No. 10/011,291, filed on Dec. 11, 2001, now abandoned.

(30) Foreign Application Priority Data

Dec. 18, 2000    (JP)    ............... 2000-384382

(51) Int. Cl.
*H05K 3/30*    (2006.01)
(52) U.S. Cl. ............ 29/832; 29/840; 438/106; 438/127
(58) Field of Classification Search ......... 29/832, 29/840; 438/106, 127
See application file for complete search history.

(56) References Cited

U.S. PATENT DOCUMENTS 5,612,576 A    3/1997    Wilson et al.
5,997,379 A *  12/1999   Kimura ................. 445/25
6,057,597 A    5/2000    Farnworth et al.
6,262,513 B1   7/2001    Furukawa et al.
6,492,194 B1 * 12/2002   Bureau et al. ......... 438/106

FOREIGN PATENT DOCUMENTS

| | | |
|---|---|---|
| JP | A-9-064076 | 3/1997 |
| JP | A-9-162525 | 6/1997 |
| JP | A 10-50879 | 2/1998 |
| JP | A 10-125825 | 5/1998 |
| JP | A 11-510666 | 9/1999 |
| JP | A 2001-53092 | 2/2001 |
| JP | A 2001-176995 | 6/2001 |
| JP | A 2001/189639 | 7/2001 |
| WO | WO 97/02596 | 1/1997 |
| WO | WO 97/45955 | 12/1997 |

* cited by examiner

*Primary Examiner*—Carl J. Arbes
(74) *Attorney, Agent, or Firm*—Oliff & Berridge, PLC

(57) ABSTRACT

In a method of manufacturing an electronic device, an electronic component and a mount substrate are disposed such that one of surfaces of the electronic component faces toward one of surfaces of the mount substrate, and a connection electrode of the electronic component is electrically connected and mechanically bond to a patterned conductor of the mount substrate. A resin film is then disposed on the electronic component and the mount substrate. A gas captured in between the resin film and the electronic component is sucked through a hole provided in the mount substrate from a side of the mount substrate opposite to the electronic component. The resin film is thereby deformed to closely contact the electronic component and the mount substrate. The resin film is then heated and adhered to the mount substrate.

10 Claims, 15 Drawing Sheets

ELECTRONIC DEVICE AND MANUFACTURING SAME

This is a Division of application Ser. No. 10/011,291 filed Dec. 11, 2001, now abandoned which claims the benefit of Japanese Patent Application No. 2000-384382 filed Dec. 18, 2000. The entire disclosure of the prior application is hereby incorporated by reference herein in its entirety.

BACKGROUND OF THE INVENTION

1. Field of the Invention

The present invention relates to an electronic device comprising a mount substrate and an electronic component mounted on the mount substrate, and to a method of manufacturing such an electronic device.

2. Description of the Related Art

Surface acoustic wave devices include interdigitated electrodes formed on a surface of a piezoelectric substrate. Surface acoustic wave devices are widely used as filters in mobile communication equipment such as cellular phones.

An electronic component such as a semiconductor component is frequently used in the form of a package. The package is configured such that the electronic component is mounted on a mount substrate, connection electrodes of the electronic component are electrically connected to patterned conductors of the mount substrate, and portions connecting the connection electrodes of the electronic component and the patterned conductors of the mount substrate are sealed. The same holds true for the case where the electronic component is a surface acoustic wave device. In the present application, a device which comprises a mount substrate and an electronic component mounted on the mount substrate is referred to as an electronic device.

For electronic devices, methods for electrically connecting the connection electrodes of the electronic component to the patterned conductors of the mount substrate are broadly divided into two: a face-down bonding and a face-up bonding. In the face-down bonding, the electronic component is placed such that the surface of the electronic component having the connection electrodes formed thereon faces toward the mount substrate. On the other hand, in the face-up bonding, the electronic component is placed such that the surface of the electronic component having the connection electrodes formed thereon, faces away from the mount substrate. The face-down bonding is advantageous over the face-up bonding in terms of downsizing of the electronic device.

In general, according to a conventional method of manufacturing an electronic device employing the face-down bonding, after electrically connecting the connection electrodes of the electronic component and the patterned conductors of the mount substrate, an underfill material is filled in between the electronic component and the mount substrate to seal the portions where the connection electrode of the electronic component and the patterned conductor of the mount substrate are electrically connected to each other.

When a surface acoustic wave device is used as the electronic component, however, the aforementioned general method cannot be employed because of a problem typical of the surface acoustic wave device. The problem typical of the surface acoustic wave device derives from the fact that the surface acoustic wave device has interdigitated electrodes formed on a surface thereof. That is, while the surface acoustic wave device needs to be sealed in order to prevent the interdigitated electrodes from being contaminated by moisture or foreign materials such as dust particles, it is necessary to prevent a resin or the like for the sealing from touching the surface acoustic wave propagation region on the surface of the surface acoustic wave device so as not to adversely affect the operation of the surface acoustic wave device.

Therefore, in a conventional method for manufacturing an electronic device comprising a surface acoustic wave device as its electronic component, after the connection electrode of the surface acoustic wave device is electrically connected to the patterned conductor of the mount substrate, the surface acoustic wave device is enclosed and sealed with a cap-like structure formed of ceramics or metal. There is another method available for manufacturing an electronic device comprising a surface acoustic wave device as its electronic component. In this method, after the connection electrode of the surface acoustic wave device is electrically connected to the patterned conductor of the mount substrate, the surface acoustic wave device is enclosed and sealed with a side-fill material.

In each of Published Unexamined Japanese Patent Applications Heisei 10-125825, 2001-53092, and 2001-176995, disclosed is a method of manufacturing an electronic device comprising a chip-type electronic component mounted on a substrate.

According to the method disclosed in Published Unexamined Japanese Patent Application Heisei 10-125825, the chip-type electronic component is first mounted on the substrate through flip chip bonding. Then, the electronic component is covered with a sealing film made of a resin. Then, the film is pressed against the substrate at around the electronic component with a stamping die to adhere the film to the substrate, thereby sealing the electronic component with the film. In Published Unexamined Japanese Patent Application Heisei 10-125825, disclosed are two methods for adhering the sealing film to the substrate: one making use of adhesiveness of the film and the other employing an adhesive.

In the method disclosed in Published Unexamined Japanese Patent Application 2001-53092, the chip-type electronic component is first mounted on the substrate. Then, an adhesive is applied to areas of a flexible sheet and/or the substrate at which the sheet and the substrate are to be bonded to each other. The electronic component is then covered with the sheet. Then, a gas captured in a cavity defined by the sheet and the substrate is sucked through a small hole provided in the substrate. Thereafter, the sheet is pressed against the substrate using a shaping tool, thereby causing the adhesive to bond the sheet to the substrate.

In the method disclosed in Published Unexamined Japanese Patent Application 2001-176995, the chip-type electronic component is first mounted on the substrate. Then, a deformed film is placed onto the electronic component. A gas captured therebetween is sucked through a hole provided in the substrate to fit the deformed film onto the electronic component and adhere the deformed film to the substrate. In Published Unexamined Japanese Patent Application 2001-176995, disclosed are two methods for adhering the deformed film to the substrate: one employing an adhesive and the other making use of the thermo-adhering property of the deformed film.

Among the methods of manufacturing the electronic device comprising a surface acoustic wave device as its electronic component, the one in which the surface acoustic wave device is enclosed and sealed with a cap-like structure presents a problem in that it is difficult to downsize the electronic device. Another problem with this method is that it is impossible to improve the strength and stability of mechanical bonding between the connection electrode of the surface acoustic wave device and the patterned conductor of the mount substrate, because the aforementioned structure does not contribute to the mechanical bonding between the connection electrode of the surface acoustic wave device and the patterned conductor of the mount substrate.

Among the methods of manufacturing the electronic device comprising a surface acoustic wave device as its electronic component, the one in which the surface acoustic wave device is enclosed and sealed with a side-fill material has a problem in that the side-fill material can enter the surface acoustic wave propagation region on the surface of the surface acoustic wave device.

When the electronic device is an oscillator or a high-frequency circuit component, too, as in the case of the surface acoustic wave device, operation of the electronic component can be adversely affected by a sealing resin if the resin touches the surface of the electronic device. Accordingly, the aforementioned problems also arise when an oscillator or a high-frequency circuit component is used as the electronic component, as in the case of a surface acoustic wave device.

On the other hand, according to the methods disclosed in Published Unexamined Japanese Patent Applications Heisei 10-125825, 2001-53092, and 2001-176995, it is possible to seal the electronic component without causing the sealing resin or the like to touch the surface of the electronic component.

The method disclosed in Published Unexamined Japanese Patent Application Heisei 10-125825, however, involves mechanical driving of the stamping die, which requires large-scale equipment to manufacture the electronic device. The manufacturing process therefore becomes complicated.

The method disclosed in Published Unexamined Japanese Patent Application 2001-53092 involves a cumbersome step of applying an adhesive to the areas of the sheet and/or the substrate at which the sheet and the substrate are to be bonded to each other.

According to the method disclosed in Published Unexamined Japanese Patent Application 2001-176995, the deformed film is used to package the electronic component. In this publication, disclosed is a technique of fitting the deformed film onto the electronic component by suction through a hole provided on the substrate. However, the publication does not disclose that the film is deformed by the suction through the hole provided in the substrate. It is thus conceivable that the deformed film mentioned in this publication is a film that has been shaped in advance to fit the outer shape of the electronic component. Therefore, the method disclosed in Published Unexamined Japanese Patent Application 2001-176995 requires the step of preparing the deformed film, and this step is also cumbersome.

For a band pass filter employing a surface acoustic wave device, the center frequency of its passband is set, for example, at around 1800 MHz. In this case, a permissible shift of the center frequency of an actual filter from the desired center frequency is about +/−1.2 MHz at maximum. The band pass filter employing a surface acoustic wave device thus requires its center frequency to be set with extremely high accuracy.

On the other hand, in the case of manufacturing the electronic device through the steps of covering the surface acoustic wave device mounted on the substrate with a resin film, and then heating the film to thereby adhere the film to the substrate, there is a problem in that the processing for adhering the film may cause a change in characteristics of the surface acoustic wave device. This is conceivably because at the initial stage of heating the film at a high temperature, the volatile components in the resin of the film come out into the environment and deposit on the surface acoustic wave device. For a band pass filter employing a surface acoustic wave device, a change in the characteristics of the surface acoustic wave device can cause a shift of the center frequency in a passband of the filter, and a degradation in transmission characteristics of the filter such as an increase in the insertion loss, in particular.

OBJECTS AND SUMMARY OF THE INVENTION

It is therefore a first object of the invention to provide a method of manufacturing an electronic device comprising a mount substrate and an electronic component mounted on the mount substrate which makes it possible to improve the strength and stability of mechanical bonding between a connection electrode of the electronic component and a patterned conductor of the mount substrate, through simple steps and without adversely affecting the operation of the electronic component.

In addition to the aforementioned first object, a second object of the invention is to provide a method of manufacturing the electronic device which makes it possible to effect sealing of the electronic component through simple steps and without adversely affecting the operation of the electronic component.

A third object of the invention is to provide an electronic device comprising a mount substrate and an electronic component mounted on the mount substrate which makes it possible to improve the strength and stability of mechanical bonding between the connection electrode of the electronic component and the patterned conductor of the mount substrate, with a simple configuration and without adversely affecting the operation of the electronic component.

In addition to the aforementioned third object, a fourth object of the invention is to provide an electronic device which makes it possible to effect sealing of the electronic component with a simple configuration and without adversely affecting the operation of the electronic component.

A method of the invention is provided for manufacturing an electronic device comprising: a mount substrate having a patterned conductor exposed on one of surfaces of the mount substrate; and an electronic component having a connection electrode formed on one of surfaces of the electronic component, the one of the surfaces of the electronic component that has the connection electrode formed thereon being disposed to face toward the one of the surfaces of the mount substrate, the connection electrode being electrically connected and mechanically bonded to the patterned conductor of the mount substrate.

The method comprises the steps of:

disposing the electronic component and the mount substrate such that the one of the surfaces of the electronic component faces toward the one of the surfaces of the mount substrate, and electrically connecting and mechanically bonding the connection electrode of the electronic component to the patterned conductor of the mount substrate;

placing a resin film over the electronic component and the mount substrate;

deforming the resin film by sucking a gas existing on an electronic-component side of the mount substrate from the other side of the mount substrate through a hole provided in the mount substrate, such that the resin film covers the electronic component and the mount substrate in close contact with a surface of the electronic component that is farther from the mount substrate and with a part of the one of the surfaces of the mount substrate, the part being located around the electronic component; and adhering the resin film to the mount substrate by heating the resin film to cause the resin film to fluidize and thereafter to harden.

According to the method of manufacturing the electronic device of the invention, the resin film covers the electronic component and the mount substrate, being in close contact with the surface of the electronic component farther from the mount substrate and with the part of the one of the surfaces of the mount substrate located around the electronic component, and is adhered to the mount substrate. The resin film acts to reinforce the mechanical bonding between the connection electrode of the electronic component and the patterned conductor of the mount substrate.

In the method of manufacturing the electronic device of the invention, the resin film may seal the electronic component. On the other hand, a cavity may be formed between the one of the surfaces of the electronic component and the one of the surfaces of the mount substrate.

In the method of manufacturing the electronic device of the invention, the resin film may be deformed with the resin film softened in the step of deforming the resin film.

In the method of manufacturing the electronic device of the invention, the hole formed in the mount substrate may be disposed at a center portion of a region of the mount substrate where the electronic component is placed. In this case, the method of manufacturing the electronic device may further comprise the step of closing the hole after the step of adhering the resin film.

In the method of manufacturing the electronic device of the invention, the hole formed in the mount substrate may be disposed around a region of the mount substrate where the electronic component is placed, and the hole may be closed with the resin film in the step of adhering the resin film.

In the method of manufacturing the electronic device of the invention, the hole formed in the mount substrate may be a through hole for electrically connecting the patterned conductor disposed on the one of the surfaces of the mount substrate and another conductor provided in the mount substrate.

The method of manufacturing the electronic device of the invention may further comprise the step of predetermining a relationship between a processing condition employed in the step of adhering the resin film and a change in characteristics of the electronic component between before and after the step of adhering the resin film, and, in the step of adhering the resin film, the processing condition may be controlled based on the relationship mentioned above, so as to obtain desired characteristics of the electronic component. In this case, the processing condition may include at least one of a temperature of the resin film as heated and a period of time over which the resin film is heated. The resin film may contain a hardening accelerator, and the processing condition may include a content of the hardening accelerator contained in the resin film.

An electronic device according to the invention comprises: a mount substrate having a patterned conductor exposed on one of surfaces of the mount substrate; and an electronic component having a connection electrode formed on one of surfaces of the electronic component, the one of the surfaces of the electronic component that has the connection electrode formed thereon being disposed to face toward the one of the surfaces of the mount substrate, the connection electrode being-electrically connected and mechanically bonded to the patterned conductor of the mount substrate; and a resin film that covers the electronic component and the mount substrate in close contact with a surface of the electronic component that is farther from the mount substrate and with a part of the one of the surfaces of the mount substrate, the part being located around the electronic component, the resin film being adhered to the mount substrate after having been fluidized and thereafter hardened by heating.

The mount substrate has a hole used to suck therethrough a gas existing on the electronic-component side of the mount substrate from the other side of the mount substrate to thereby define a shape of the resin film.

According to the electronic device of the invention, the resin film covers the electronic component and the mount substrate, being in close contact with the surface of the electronic component farther from the mount substrate and with the part of the one of the surfaces of the mount substrate located around the electronic component, and is adhered to the mount substrate. The resin film acts to reinforce the mechanical bonding between the connection electrode of the electronic component and the patterned conductor of the mount substrate.

In the electronic device of the invention, the resin film may seal the electronic component. On the other hand, a cavity may be formed between the one of the surfaces of the electronic component and the one of the surfaces of the mount substrate.

In the electronic device of the invention, the hole of the mount substrate may be disposed at a center portion of a region of the mount substrate where the electronic component is placed. In this case, the electronic device may further comprise a plug member for closing the hole of the mount substrate.

In the electronic device of the invention, the hole of the mount substrate may be disposed around a region of the mount substrate where the electronic component is placed, and the hole may be closed with the resin film.

In the electronic device of the invention, the hole formed in the mount substrate may be a through hole for electrically connecting the patterned conductor disposed on the one of the surfaces of the mount substrate and another conductor provided in the mount substrate.

Other and further objects, features and advantages of the invention will appear more fully from the following description.

DETAILED DESCRIPTION OF THE PREFERRED EMBODIMENTS

Embodiments of the invention will now be described in detail with reference to accompanying drawings.

[First Embodiment]

Figure 1:
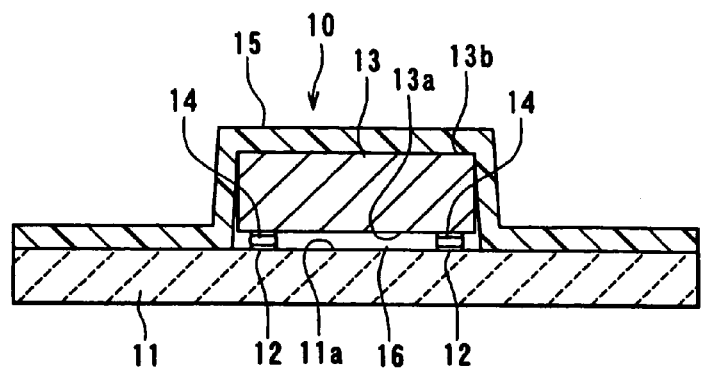
FIG. 1 is a cross-sectional view illustrating an electronic device according to a first embodiment of the invention.

Reference is now made to FIG. 1 to describe a configuration of an electronic device according to a first embodiment of the invention. An electronic device 10 according to this embodiment comprises a mount substrate 11 having patterned conductors 12 that are patterned into predetermined shapes and exposed on a surface 11a of the mount substrate 11, and an electronic component 13 having connection electrodes 14 formed on a surface 13a thereof. The surface 13a of the electronic component, on which the connection electrodes 14 are formed, is disposed to face toward the surface 11a of the mount substrate 11, and the connection electrodes 14 are electrically connected and mechanically bonded to the patterned conductors 12 of the mount substrate 11. The electronic device 10 further comprises a resin film 15 that is adhered to the substrate 11. The resin film 15 covers the electronic component 13 and the mount substrate 11 in close contact with a surface 13b of the electronic component 13 that is located farther from the mount substrate 11 and with a part of the surface 11a of the mount substrate 11, the part being located around the electronic component 13.

The mount substrate 11 is formed of glass, resin, ceramics or the like. The electronic component 13 may be, for example, a surface acoustic wave device, an oscillator, or a high-frequency circuit component, or may be other electronic components. As described in the foregoing, the electronic component 13 is mounted on the mount substrate 11 through face-down bonding such that the surface 13a having the connection electrodes 14 formed thereon faces toward the mount substrate 11. There is formed a cavity 16 in between the surface 13a of the electronic component 13 and the surface 11a of the mount substrate 11.

The surface 13b of the electronic component 13 farther from the mount substrate 11 is covered with the resin film 15 with no space left therebetween. The part of the surface 11a of the mount substrate 11 located around the electronic component 13 is also covered with the resin film 15 with no space left therebetween. The resin film 15 seals the entire electronic component 13 including the portions where the connection electrodes 14 of the electronic component 13 and the patterned conductors 12 of the mount substrate 11 are electrically connected to each other.

For example, the resin film 15 is formed of a thermosetting resin such as an epoxy resin. The resin film 15 has a thickness of 50 to 150 µm, for example.

Now, a method of manufacturing the electronic device 10 according to this embodiment will be briefly described. The method of manufacturing the electronic device 10 includes the steps of: disposing the electronic component 13 and the mount substrate 11 such that the surface 13a of the electronic component 13 faces toward the surface 11a of the mount substrate 11, and electrically connecting and mechanically bonding the connection electrodes 14 of the electronic component 13 to the patterned conductors 12 of the mount substrate 11; and placing the resin film 15 such that the resin film 15 covers the electronic component 13 and the mount substrate 11 in close contact with the surface 13b of the electronic component 13 located farther from the mount substrate 11 and with the part of the surface 11a of the mount substrate 11 located around the electronic component 13, and adhering the resin film 15 to the mount substrate 11.

Figure 2:
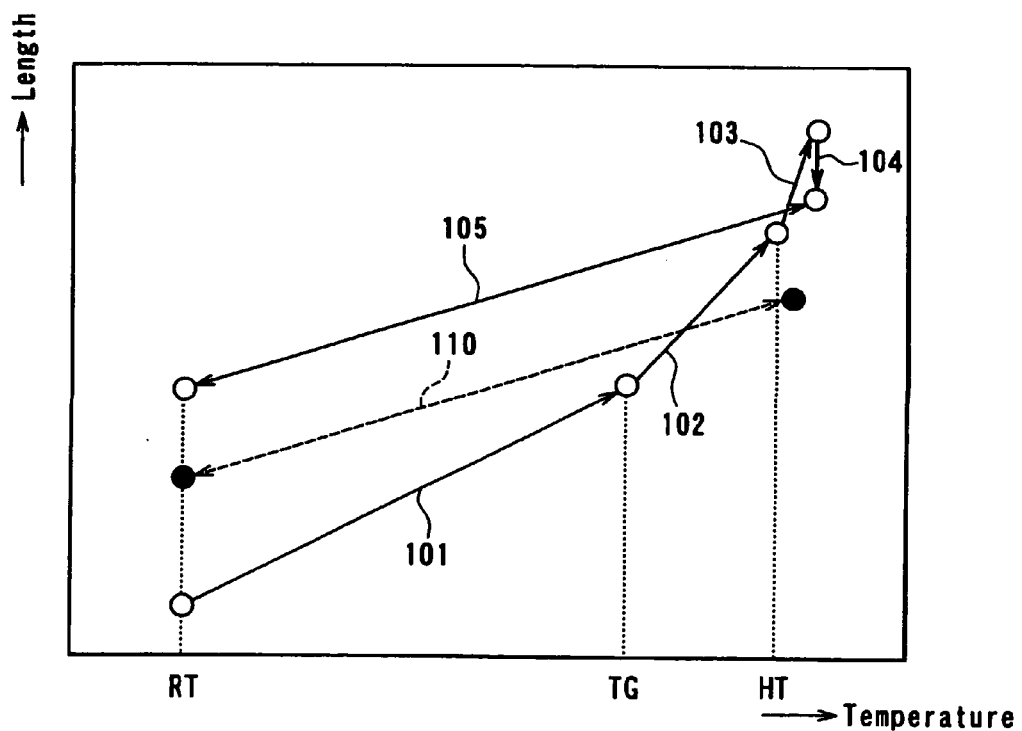
FIG. 2 is an explanatory view conceptually illustrating an example of characteristics of a resin film used in the first embodiment of the invention.

Reference is now made to FIG. 2 to conceptually describe an example of the characteristics of the resin film 15 used in this embodiment. In FIG. 2, white dots and solid lines indicate the relationship between temperature of the resin film 15 and its length in a given direction. In FIG. 2, black dots and a dashed line indicate the relationship between temperature of a resin such as a BT (Bismaleimide Triazine) resin, which is stable in shape against variations in temperature, and its length in a given direction, for comparison with the characteristics of the resin film 15. As shown by reference numeral 110, the resin that is stable in shape against variations in temperature varies its length substantially linearly with changes in temperature.

The resin film 15 maintains the shape of a film at room temperature RT. As shown by reference numeral 101, as the temperature of the resin film 15 increases from the room temperature RT to its glass transition temperature TG, the resin film 15 is gradually softened while expanding so as to vary its length substantially linearly with changes in the temperature. As shown by reference numeral 102, as the temperature of the resin film 15 increases from its glass transition temperature TG to its hardening starting temperature HT, the resin film 15 becomes fluidized and expands suddenly. As shown by reference numeral 103, when the resin film 15 is heated to a temperature equal to or greater than the hardening starting temperature HT, the resin film 15 starts hardening. As shown by reference numeral 104, when the resin film 15 has completely hardened, the resin film 15 contracts. At this stage, a force acting to contract the resin film 15 (hereinafter referred to as the contracting force) is produced. As shown by reference numeral 105, after the resin film 15 has completely hardened, the resin film 15 is now stable in shape against variations in temperature and will not soften or fluidize again even if the temperature rises. The hardening starting temperature HT is about 150 to 200° C., for example, although it differs depending on characteristics of the resin film 15. For example, if the resin film 15 is formed of an epoxy resin, it has a hardening starting temperature HT of about 150° C. The time between start and completion of hardening of the resin film 15 also differs depending on the characteristics of the resin film 15.

The characteristics of the resin film 15 shown in FIG. 2 are strictly conceptual. Accordingly, for example, if the amount of variation in the temperature per unit time changes, the characteristics of the resin film 15 will also change.

In the method of manufacturing the electronic device 10 according to this embodiment, for example, with the resin film softened by raising its temperature, the resin film 15 is deformed to cover the electronic component 13 and the mount substrate 11 in close contact uniformly with the surface 13b of the electronic component 13 located farther from the mount substrate 11 and with the part of the surface 11a of the mount substrate 11 located around the electronic component 13. Thereafter, the temperature of the resin film 15 is further raised to cause the resin film 15 to fluidize, and then to harden. The resin film 15 is thereby adhered to the mount substrate 11 and fixed in shape. As described above, hardening of the resin film 15 causes a contracting force to occur. The contracting force of the resin film 15 acts to push the electronic component 13 toward the mount substrate 11. This reinforces the mechanical bonding between the connection electrodes 14 of the electronic component 13 and the patterned conductors 12 of the mount substrate 11 to make it more reliable. The contraction of the resin film 15 also causes the resin film 15 to come into closer contact with the electronic component 13 and the mount substrate 11.

When the resin film 15 is sufficiently flexible at room temperature, the resin film 15 may be deformed at room temperature to define its shape, and then heated to harden the resin film 15.

Alternatively, the shape of the resin film 15 may be defined while softening the resin film 15 at its glass transition temperature or lower, and then it may be hardened by spending a relatively long period of time at the glass transition temperature or lower.

If the resin film 15 is formed of a resin that softens with ultraviolet light, the resin film 15 may be softened by irradiation with ultraviolet light, instead of raising its temperature. Alternatively, the resin film 15 may be softened by both raising its temperature and irradiating it with ultraviolet light.

On the other hand, if the resin film 15 is formed of a resin that hardens with ultraviolet light, the resin film 15 may be hardened by irradiation with ultraviolet light, instead of by raising its temperature. Alternatively, the resin film 15 may be hardened by both raising its temperature and irradiating it with ultraviolet light.

In this embodiment, various methods are available for effecting electrical connection and mechanical bonding between the connection electrodes 14 of the electronic component 13 and the patterned conductors 12 of the mount substrate 11. Now, described below are some examples of the methods for effecting electrical connection and mechanical bonding between the connection electrodes 14 of the electronic component 13 and the patterned conductors 12 of the mount substrate 11 (hereinafter simply referred to as bonding methods).

Figure 3:
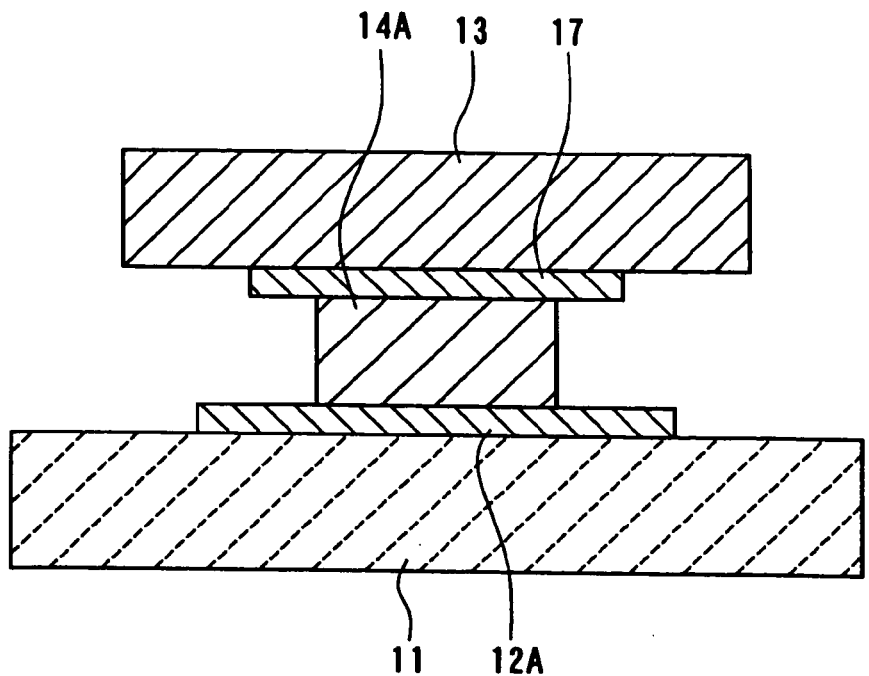
FIG. 3 is a cross-sectional view illustrating an example of a related-art bonding method shown for comparison with the first embodiment of the invention.
Figure 4:
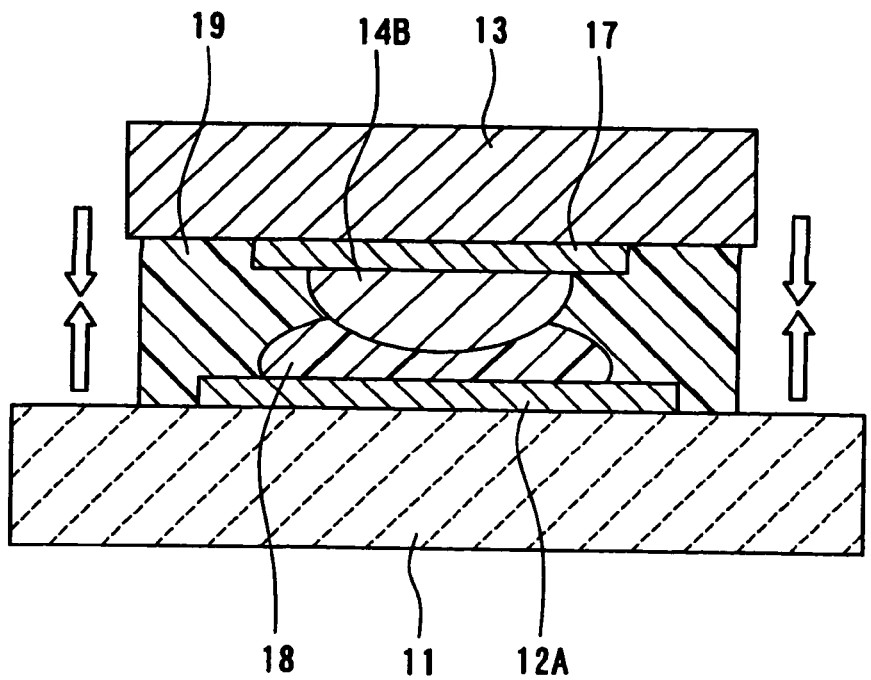
FIG. 4 is a cross-sectional view illustrating another example of a related-art bonding method shown for comparison with the first embodiment of the invention.
Figure 5:
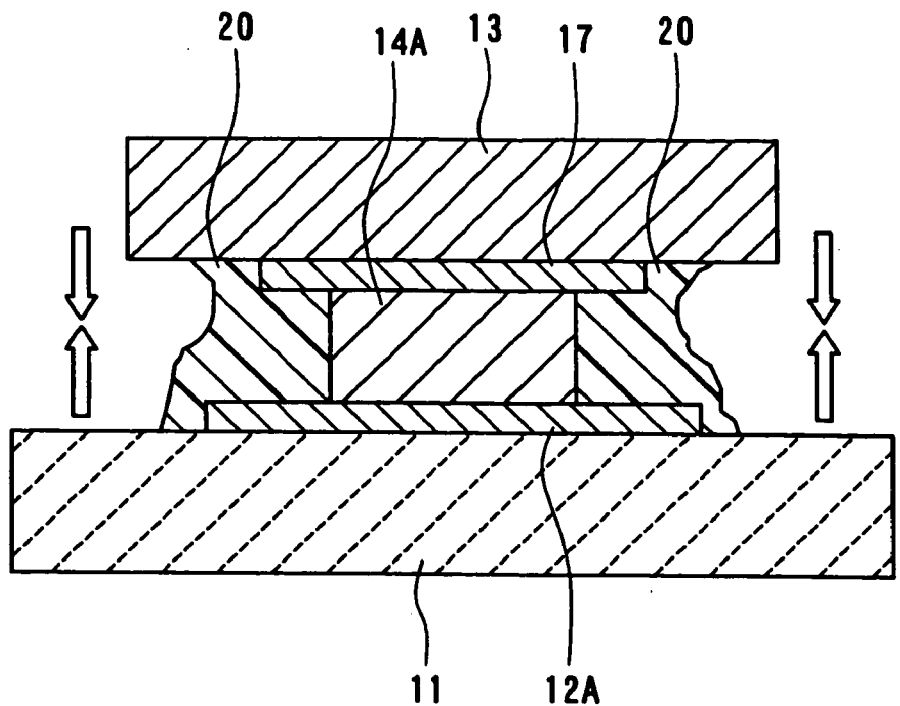
FIG. 5 is a cross-sectional view illustrating still another example of a related-art bonding method shown for comparison with the first embodiment of the invention.

Reference is now made to FIG. 3 to FIG. 5 to describe an example of a related-art bonding method for comparison with the embodiment of the invention. In FIG. 3 to FIG. 5, the portion where the connection electrode 14 of the electronic component 13 and the patterned conductor 12 of the mount substrate 11 are electrically connected and mechanically bonded to each other is shown larger than other portions.

In the example shown in FIG. 3, as the connection electrode 14 of the electronic component 13, there is provided a bump 14A that is formed of gold, for example, and connected to a patterned conductor 17 of the electronic component 13. On the other hand, the mount substrate 11 is provided with a connecting portion 12A that is formed of gold, for example, and forms a part of the patterned conductor 12. In this example, the bump 14A and the connecting portion 12A are bonded to each other by utilizing metallic bond, and are thereby electrically connected and mechanically bonded to each other.

In the example shown in FIG. 4, as the connection electrode 14 of the electronic component 13, there is provided a bump 14B that is formed of gold, for example, and connected to the patterned conductor 17 of the electronic component 13. On the other hand, the mount substrate 11 is provided with the connecting portion 12A that is formed of gold, for example, and forms a part of the patterned conductor 12. In this example, the bump 14B and the connecting portion 12A are electrically connected to each other with a conductive paste 18. Then, an underfill material 19 is filled in between the electronic component 13 and the mount substrate 11. A contracting force of the underfill material 19 acts to attain stable mechanical bonding among the bump 14B, the conductive paste 18, and the connecting portion 12A.

In the example shown in FIG. 5, as the connection electrode 14 of the electronic component 13, there is provided the bump 14A that is formed of gold, for example, and connected to the patterned conductor 17 of the electronic component 13. On the other hand, the mount substrate 11 is provided with the connecting portion 12A that is formed of gold, for example, and forms a part of the patterned conductor 12. In this example, the bump 14A and the connecting portion 12A are disposed to be in contact with each other, and are thereby electrically connected with each other. A bonding paste 20, which is non-conductive or anisotropically conductive, is injected into between the electronic component 13 and the mount substrate 11 around the bump 14A and the connecting portion 12A. A contracting force of the bonding paste 20 acts to attain stable mechanical bonding between the bump 14A and the connecting portion 12A.

Figure 6:
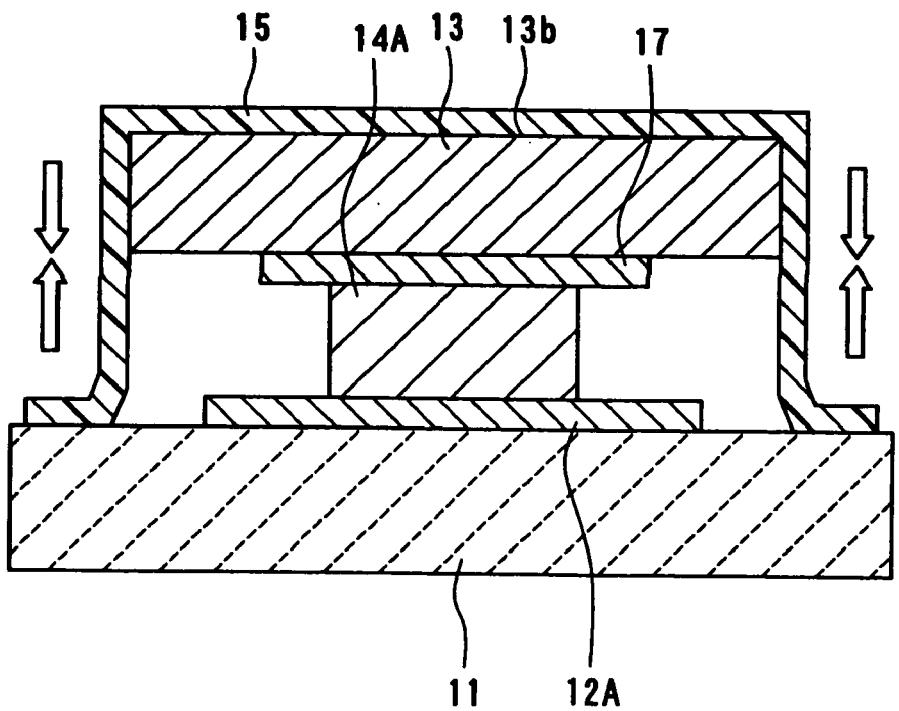
FIG. 6 is a cross-sectional view illustrating an example of a bonding method employed in the first embodiment of the invention.
Figure 7:
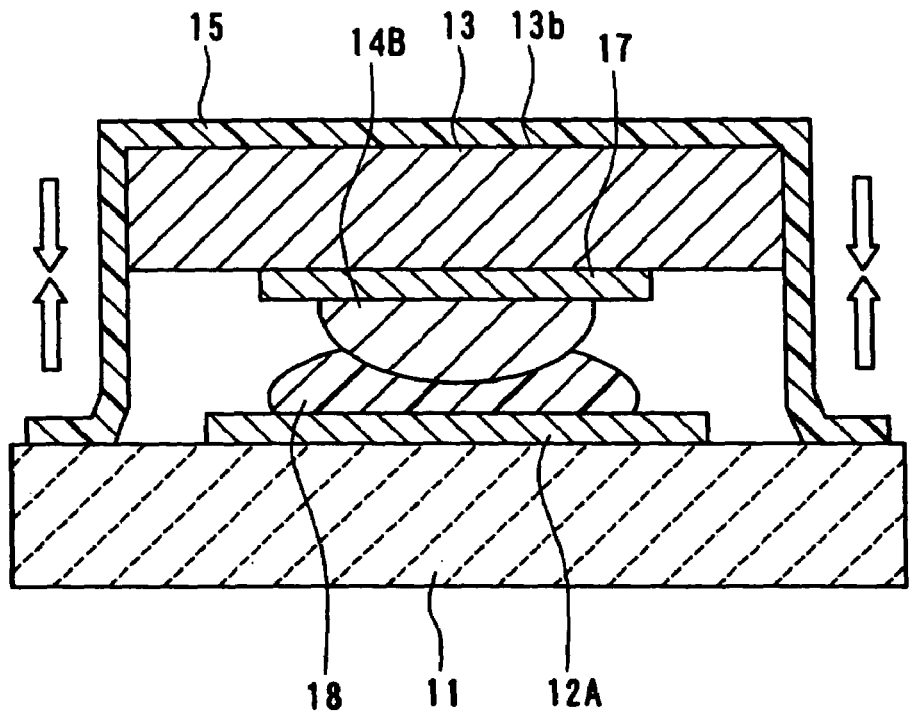
FIG. 7 is a cross-sectional view illustrating another example of the bonding method employed in the first embodiment of the invention.
Figure 8:
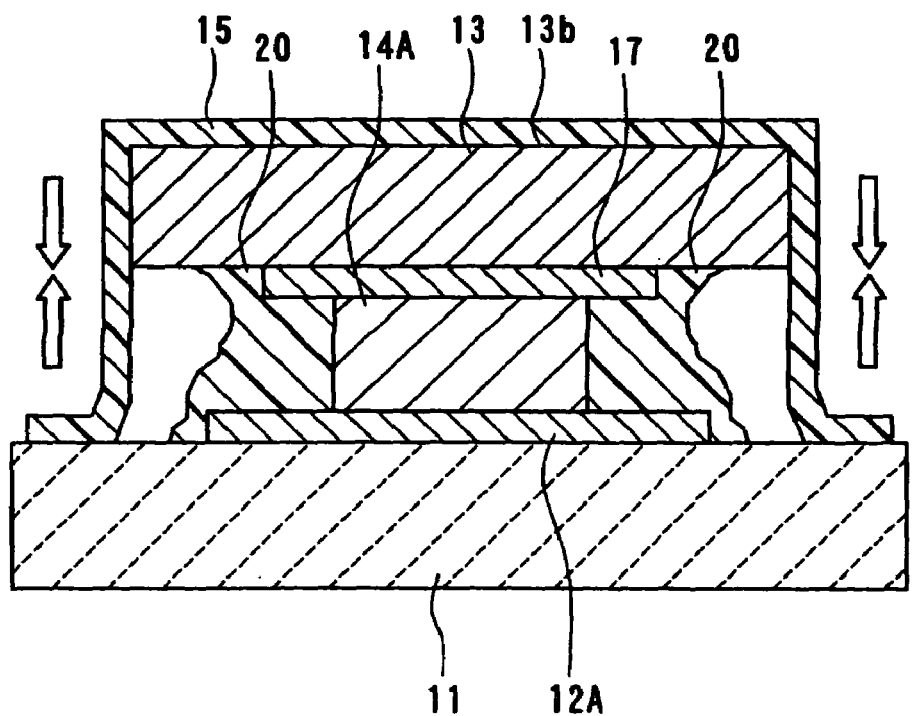
FIG. 8 is a cross-sectional view illustrating still another example of the bonding method employed in the first embodiment of the invention.

Reference is now made to FIG. 6 to FIG. 8 to describe the bonding method employed in the embodiment. In FIG. 6 to FIG. 8, the portion where the connection electrode 14 of the electronic component 13 and the patterned conductor 12 of the mount substrate 11 are electrically connected and mechanically bonded to each other is shown larger than other portions.

In the example shown in FIG. 6, like the example shown in FIG. 3, as the connection electrode 14 of the electronic component 13, there is provided the bump 14A that is formed of gold, for example, and connected to the patterned conductor 17 of the electronic component 13. On the other hand, the mount substrate 11 is provided with the connecting portion 12A that is formed of gold, for example, and forms a part of the patterned conductor 12. The bump 14A and the connecting portion 12A are bonded to each other by utilizing metallic bond, and are thereby electrically connected and mechanically bonded to each other. This example is further provided with the resin film 15 according to the embodiment. A contracting force of the resin film 15 acts to reinforce the mechanical bonding between the bump 14A and the connecting portion 12A.

In the example shown in FIG. 7, like the example shown in FIG. 4, as the connection electrode 14 of the electronic component 13, there is provided the bump 14B that is formed of gold, for example, and connected to the patterned conductor 17 of the electronic component 13. On the other hand, the mount substrate 11 is provided with the connecting portion 12A that is formed of gold, for example, and forms a part of the patterned conductor 12. The bump 14B and the connecting portion 12A are electrically connected to each other with the conductive paste 18. This example is further provided with the resin film 15 according to the embodiment. A contracting force of the resin film 15 acts to attain stable mechanical bonding among the bump 14B, the conductive paste 18 and the connecting portion 12A, without using the underfill material 19.

In the example shown in FIG. 8, like the example shown in FIG. 5, as the connection electrode 14 of the electronic component 13, there is provided the bump 14A that is formed of gold, for example, and connected to the patterned conductor 17 of the electronic component 13. On the other hand, the mount substrate 11 is provided with the connecting portion 12A that is formed of gold, for example, and forms a part of the patterned conductor 12. The bump 14A and the connecting portion 12A are disposed to be in contact with each other, and are thereby electrically connected to each other. The bonding paste 20, which is non-conductive or anisotropically conductive, is injected into between the electronic component 13 and the mount substrate 11 around the bump 14A and the connecting portion 12A. A contracting force of the bonding paste 20 acts to attain stable mechanical bonding between the bump 14A and the connecting portion 12A. This example is further provided with the resin film 15 according to the embodiment. A contracting force of the resin film 15 acts to reinforce the mechanical bonding between the bump 14A and the connecting portion 12A.

The bonding methods in the embodiment of the invention are not limited to those shown in FIG. 6 to FIG. 8, and it is possible to use almost all the conventional bonding methods for use with face-down bonding.

Figure 9:
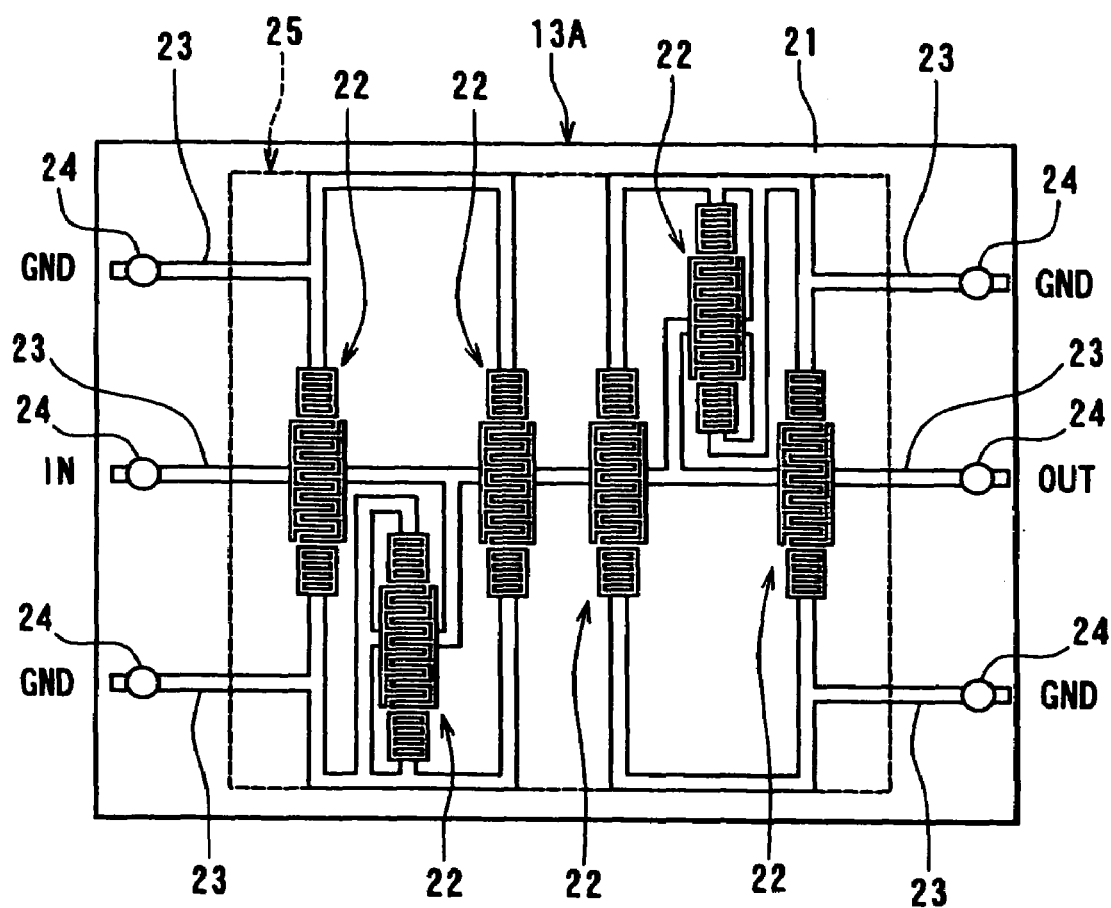
FIG. 9 is a plan view illustrating an example of a surface acoustic wave device employed as an electronic component in the first embodiment of the invention.

Reference is now made to FIG. 9 to describe an example of a surface acoustic wave device 13A employed as the electronic component 13. The surface acoustic wave device 13A shown in FIG. 9 comprises: a piezoelectric substrate 21; interdigitated electrodes 22 and patterned conductors 23 that are formed on one of surfaces of the piezoelectric substrate 21; and connection electrodes 24 formed at the ends of the patterned conductors 23. The connection electrodes 24 correspond to the connection electrodes 14 shown in FIG. 1 and other figures. The surface acoustic wave device 13A uses the surface acoustic wave generated by the interdigitated electrodes 22 for its basic operation, and functions as a band pass filter in this embodiment.

In FIG. 9, a connection electrode 24 denoted by symbol "IN" is an input terminal, a connection electrode 24 denoted by symbol "OUT" is an output terminal, and connection electrodes 24 denoted by symbol "GND" are ground terminals. Additionally, in FIG. 9, the region surrounded by a dashed line indicated by reference numeral 25 includes a surface acoustic wave propagation region, which has to be protected from intrusion of a sealing material or the like.

Reference is now made to FIG. 10 to FIG. 14 to describe the method of manufacturing the electronic device 10 according to the embodiment in detail. In the embodiment, the electronic device 10 may be manufactured one by one or a plurality of electronic devices 10 may be manufactured at the same time. Described below is the case of manufacturing a plurality of electronic devices 10 at the same time.

Figure 10:
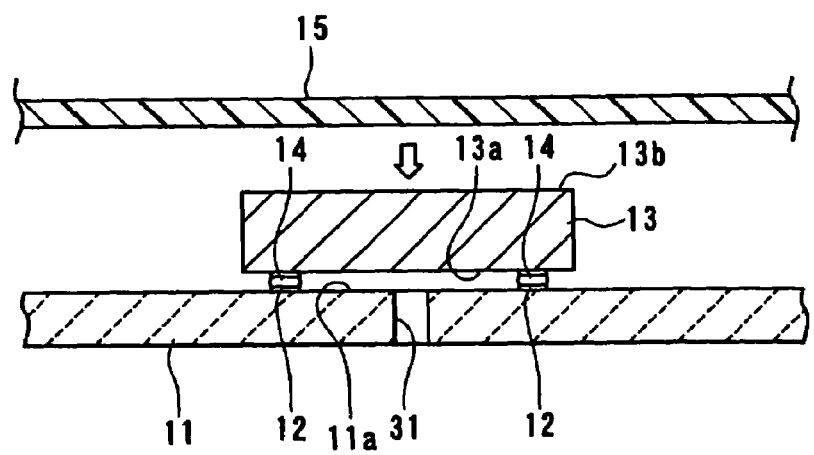
FIG. 10 is an explanatory view illustrating a step of a method of manufacturing the electronic device according to the first embodiment of the invention.

In the method of manufacturing the electronic device according to the embodiment, as shown in FIG. 10, the electronic component 13 is first disposed on the mount substrate 11 such that the surface 13a of the electronic component 13 faces toward the surface 11a of the mount substrate 11, and then the connection electrodes 14 of the electronic component 13 are electrically connected and mechanically bonded to the patterned conductors 12 of the mount substrate 11. Then, the resin film 15, which has been formed substantially in the same planar shape as that of the surface 11a of the mount substrate 11, is placed over the electronic component 13 and the mount substrate 11.

The mount substrate 11 shown in FIG. 10 includes a portion that corresponds to a plurality of electronic components 13. The mount substrate 11 is thus provided with a plurality of electronic components 13 disposed thereupon. In this embodiment, the mount substrate 11 has regions where the plurality of electronic components 13 are disposed, and each of the regions has a hole 31 disposed at a center portion thereof.

Figure 11:
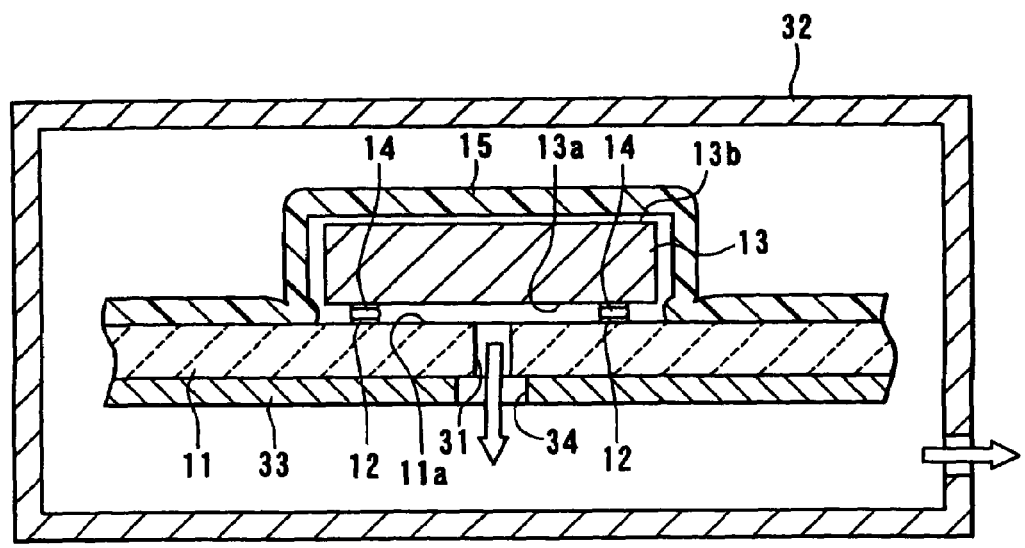
FIG. 11 is an explanatory view illustrating a step that follows FIG. 10.

Then, as shown in FIG. 11, with the resin film 15 softened by heating, a gas existing on the electronic-component-13 side of the mount substrate 11 is sucked from the other side of the mount substrate 11 through the hole 31 of the mount substrate 11. The gas mentioned here includes air, nitrogen gas, an inert gas and the like, depending on the atmosphere in which the processing is performed. The resin film 15 is thereby deformed to cover the electronic component 13 and the mount substrate 11 in close contact uniformly with the surface 13b of the electronic component 13 located farther from the mount substrate 11 and with the part of the surface 11a of the mount substrate 11 located around the electronic component 13. At this stage, the temperature of the resin film 15 is kept below the temperature at which it hardens. Thus, the shape of the resin film 15 can be easily defined by deforming the resin film 15 by sucking the gas existing on the electronic-component-13 side of the mount substrate 11 from the other side of the mount substrate 11 through the hole 31 of the mount substrate 11. Deforming the resin film 15 with the resin film 15 softened makes it easier to define the shape of the resin film 15. If the resin film 15 is sufficiently flexible at room temperature, the resin film 15 may be deformed only by the aforementioned suction without heating.

If the resin film 15 is formed of a resin that softens with ultraviolet light, the resin film 15 may be softened by irradiation with ultraviolet light, instead of raising its temperature. Alternatively, the resin film 15 may be softened by both raising its temperature and irradiating it with ultraviolet light.

This embodiment employs a pressure-reducible heating furnace 32 as means for heating the resin film 15 and for sucking the gas existing on the electronic-component-13 side of the mount substrate 11 from the other side of the mount substrate 11. However, other means may also be employed as heating means or gas sucking means. The heating furnace 32 has a heater 33 on which the mount substrate 11 is placed. The heater 33 heats the mount substrate 11 and the resin film 15. The heater 33 has a hole 34 that communicates with the hole 31 of the mount substrate 11. Exhausting the gas present in the heating furnace 32 to reduce the pressure therein causes the gas existing on the electronic-component-13 side of the mount substrate 11 to be sucked from the other side of the mount substrate 11 through the hole 34 of the heater 33 and the hole 31 of the mount substrate 11.

Figure 12:
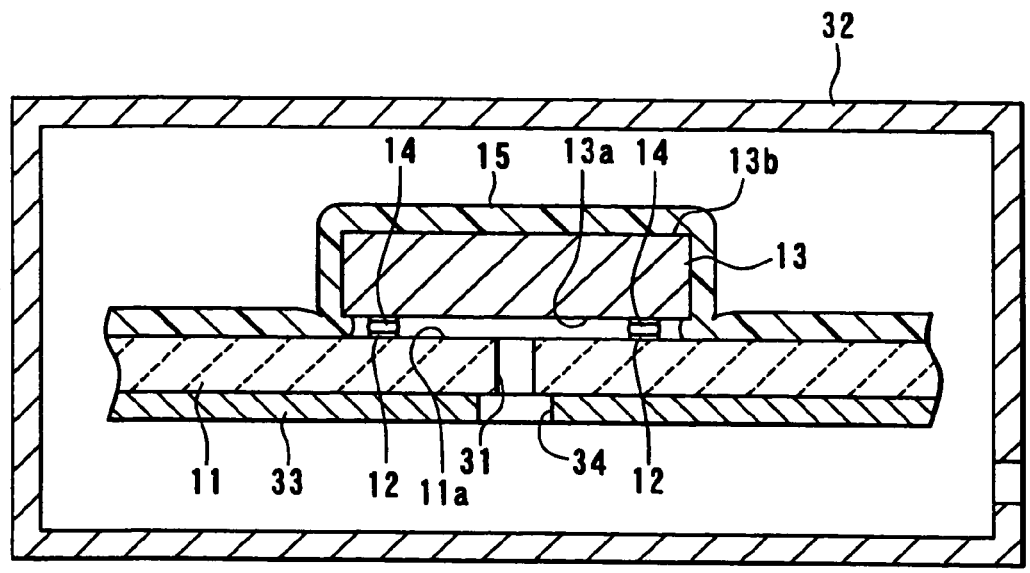
FIG. 12 is an explanatory view illustrating a step that follows FIG. 11.

Then, as shown in FIG. 12, the mount substrate 11 and the resin film 15 are heated with the heater 33 to a temperature at which the resin film 15 hardens or higher. This causes the resin film 15 to become fluidized, and thereafter hardened. The resin film 15 is then adhered to the mount substrate 11 and fixed in shape.

If the resin film 15 is formed of a resin that hardens with ultraviolet light, the resin film 15 may be hardened by irradiation with ultraviolet light, instead of raising its temperature. Alternatively, the resin film 15 may be hardened by both raising its temperature and irradiating it with ultraviolet light.

Figure 13:
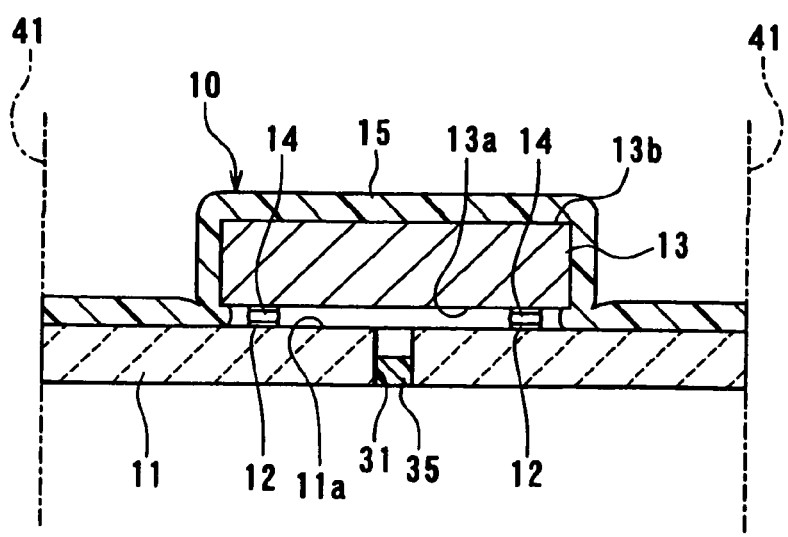
FIG. 13 is an explanatory view illustrating a step that follows FIG. 12.
Figure 14:
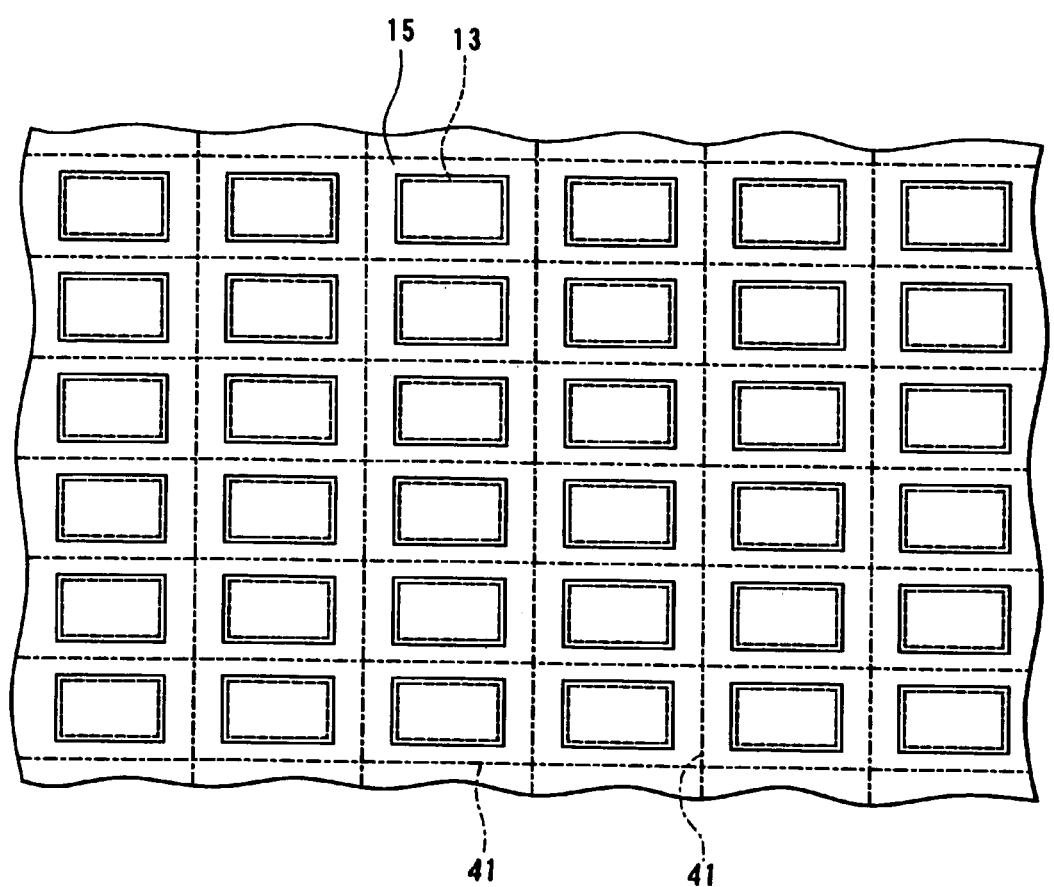
FIG. 14 is a plan view illustrating the mount substrate, the electronic component and the resin film before the cutting step shown in FIG. 13.

Then, as shown in FIG. 13, the hole 31 of the mount substrate 11 is closed with a plug member 35 formed of a sealing material or the like, as required. Then, the mount substrate 11 and the resin film 15 are cut at the position shown by reference numeral 41 in FIG. 13, thereby providing completed individual electronic devices 10. FIG. 14 is a plan view illustrating the mount substrate 11, the electronic components 13, and the resin film 15 before the cutting step shown in FIG. 13. The method for manufacturing the electronic device 10 one by one is the same as that for manufacturing a plurality of electronic devices 10 at the same time, except that the aforementioned step of cutting the mount substrate 11 and the resin film 15 is unnecessary.

As described above, in the electronic device 10 and the method of manufacturing the same according to this embodiment, the resin film 15 covers the electronic component 13 and the mount substrate 11 in close contact with the surface 13b of the electronic component 13 that is farther from the mount substrate 11 and with the part of the surface 11a of the mount substrate 11 located around the electronic component 13, and is adhered to the mount substrate 11. The resin film 15 reinforces the mechanical bonding between the connection electrodes 14 of the electronic component 13 and the patterned conductors 12 of the mount substrate 11. In this embodiment, no underfill material is interposed between the electronic component 13 and the mount substrate 11. Accordingly, this embodiment makes it possible to improve the strength and stability of the mechanical bonding between the connection electrodes 14 of the electronic component 13 and the patterned conductors 12 of the mount substrate 11, with a simple configuration and through simple steps, and without adversely affecting the operation of the electronic component 13.

Furthermore, in this embodiment, the resin film 15 is deformed by sucking the gas existing on the electronic-component-13 side of the mount substrate 11 from the other side of the mount substrate through the hole 31 formed in the mount substrate 11. Therefore, according to this embodiment it is easy to define the shape of the resin film 15.

In this embodiment, the resin film 15 is brought into close contact with the electronic component 13 and the mount substrate 11 by sucking the gas as described above. The resin film 15 is then heated to thereby cause the resin film 15 to fluidize, and thereafter to harden. The resin film 15 is then adhered to the mount substrate 11. Accordingly, when the resin film 15 is adhered to the mount substrate 11, the contracting force of the resin film 15 resulting from its hardening works to bring the resin film 15 into closer contact with the electronic component 13 and the mount substrate 11. This embodiment therefore makes it possible to improve the strength and stability of the mechanical bonding between the connection electrodes 14 of the electronic component 13 and the patterned conductors 12 of the mount substrate 11 with higher reliability.

Furthermore, in this embodiment, since the resin film 15 is used to seal the electronic component 13, sealing of the electronic component 13 can be done with a simple configuration and through simple steps, without adversely affecting the operation of the electronic component 13. This ensures the tolerance of the electronic device 10 to environment or the like. Even if the hole 31 of the mount substrate 11 is provided at the center of the region where the electronic component 13 is disposed, the electronic component 13 can be kept in the sealed state by closing the hole 31 with the plug member 35. On the other hand, when the hole 31 is so small as not to affect the sealed state of the electronic component 13, the hole 31 need not be closed.

Furthermore, according to this embodiment, the cavity 16 is provided between the surface 13a of the electronic component 13 and the surface 11a of the mount substrate 11. This prevents the surface 13a of the electronic component 13 from contacting other components or foreign materials, which can consequently eliminate possible adverse effects on the operation of the electronic device 13. This is useful when the electronic component 13 is a surface acoustic wave device, an oscillator, or a high-frequency circuit component, in particular.

With these features, this embodiment provides improved reliability of the electronic device 10. Furthermore, since the embodiment uses the resin film 15 to seal the electronic component 13, it is possible to reduce the size, weight and thickness of the electronic device 10 as compared with the case of sealing the electronic component 13 in a cap-like structure. Furthermore, using the resin film 15 to seal the electronic component 13 in the embodiment provides the aforementioned effects at low cost.

Figure 15:
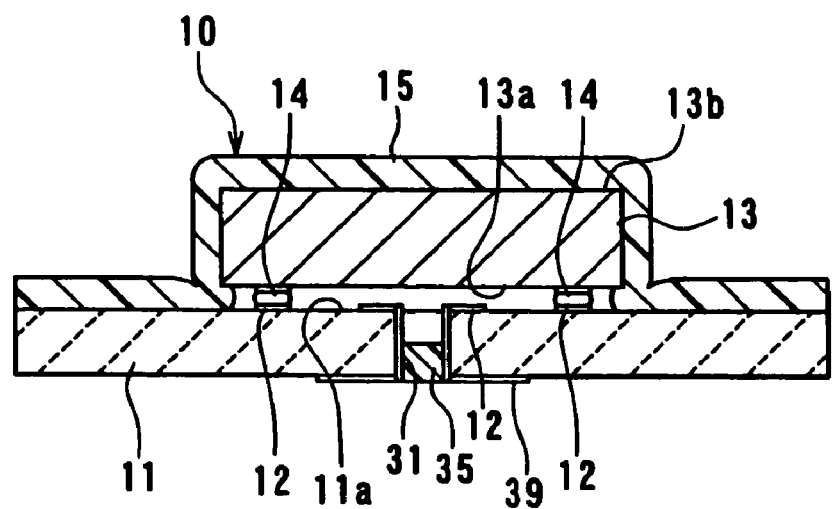
FIG. 15 is a cross-sectional view illustrating the electronic device according to the first embodiment of the invention, where a through hole is employed as a hole for sucking.

In the embodiment, the hole 31 of the mount substrate 11 is not limited to one that is specially provided for the sucking, but may be an existing hole such as a through hole. FIG. 15 is a cross-sectional view illustrating the electronic device 10 according to the embodiment where a through hole is employed as the hole 31. In the electronic device 10 shown in FIG. 15, the through hole acting as the hole 31 electrically connects the patterned conductors 12 disposed on the surface 11a of the mount substrate 11 and a conductor 39 disposed on the other surface of the mount substrate 11. When the through hole is used as the hole 31, it is not necessary to provide any special hole for the sucking in the mount substrate 11.

[Second Embodiment]

Reference is now made to FIG. 16 to FIG. 20 to describe a method of manufacturing an electronic device according to a second embodiment of the invention. In this embodiment, like the first embodiment, the electronic device 10 may be manufactured one by one or a plurality of electronic devices 10 may be manufactured at the same time. Described below is the case of manufacturing a plurality of electronic devices 10 at the same time.

Figure 16:
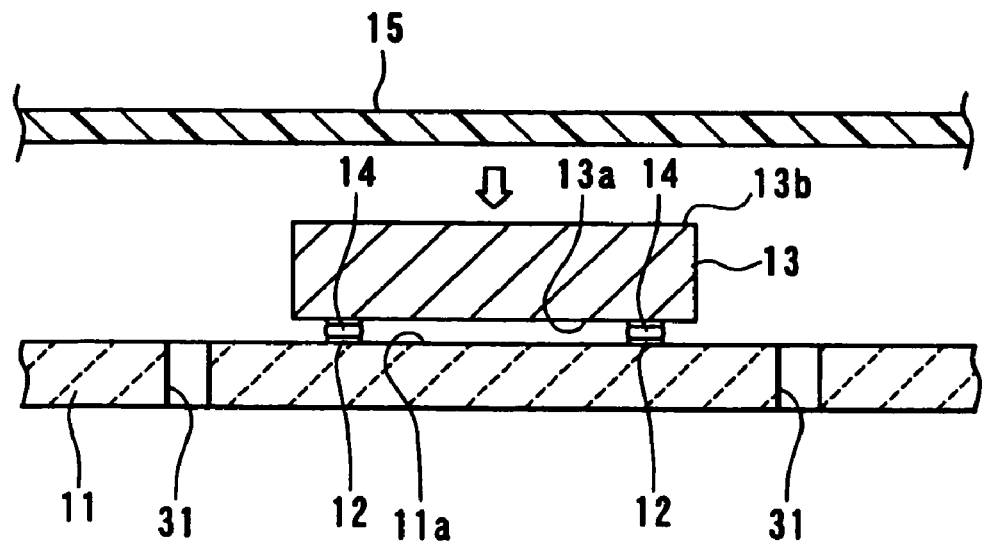
FIG. 16 is an explanatory view illustrating a step of a method of manufacturing an electronic device according to a second embodiment of the invention.

In the method of manufacturing the electronic device according to the embodiment, as shown in FIG. 16, the electronic component 13 is first disposed on the mount substrate 11 such that the surface 13a of the electronic component 13 faces toward the surface 11a of the mount substrate 11, and then the connection electrodes 14 of the electronic component 13 are electrically connected and mechanically bonded to the patterned conductors 12 of the mount substrate 11. Then, the resin film 15, which has been formed substantially in the same planar shape as that of the surface 11a of the mount substrate 11, is placed over the electronic component 13 and the mount substrate 11.

The mount substrate 11 shown in FIG. 16 includes a portion that corresponds to a plurality of electronic components 13. The mount substrate 11 is thus provided with a plurality of electronic components 13 disposed thereupon. In this embodiment, the mount substrate 11 has regions where the plurality of electronic components 13 are disposed, and a plurality of holes 31 are provided around each of the regions. For example, the holes 31 may be provided either at two points opposite to each other with an electronic component 13 located at the center therebetween, or at four points by the four sides of the electronic component 13.

Figure 17:
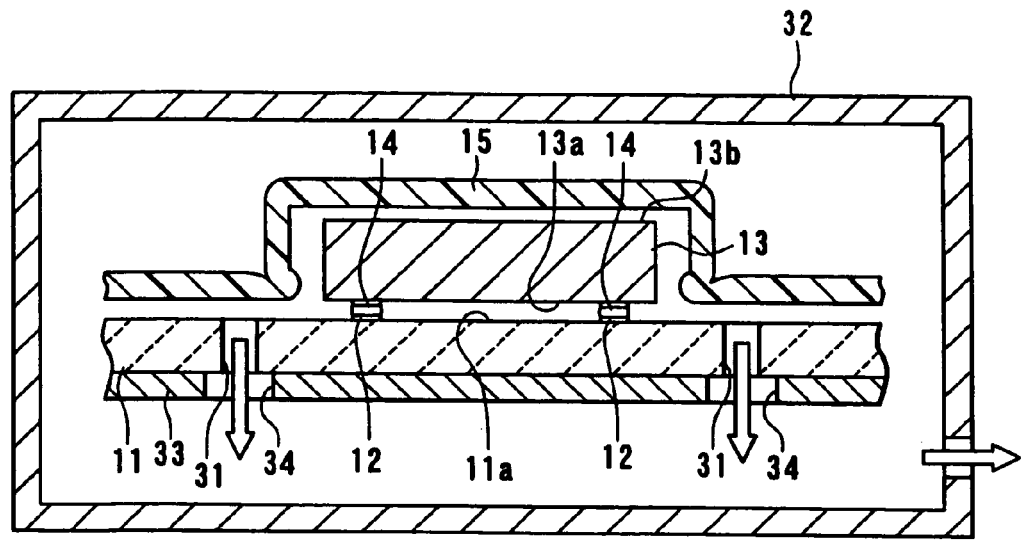
FIG. 17 is an explanatory view illustrating a step that follows FIG. 16.

Then, as shown in FIG. 17, with the resin film 15 softened by heating, the gas existing on the electronic-component-13 side of the mount substrate 11 is sucked from the other side of the mount substrate 11 through the holes 31 in the mount substrate 11. The resin film 15 is thereby deformed to cover the electronic component 13 and the mount substrate 11 in close contact uniformly with the surface 13b of the electronic component 13 located farther from the mount substrate 11 and with the part of the surface 11a of the mount substrate 11 located around the electronic component 13. At this stage, the temperature of the resin film 15 is kept below the temperature at which the resin film 15 hardens. If the resin film 15 is sufficiently flexible at room temperature, the resin film 15 may be deformed only by the aforementioned suction without heating.

Like the first embodiment, this embodiment employs the pressure-reducible heating furnace 32 as means for heating the resin film 15 and for sucking the gas existing on the electronic-component-13 side of the mount substrate 11 from the other side of the mount substrate 11. However, other means may also be employed as heating means or gas sucking means.

Figure 18:
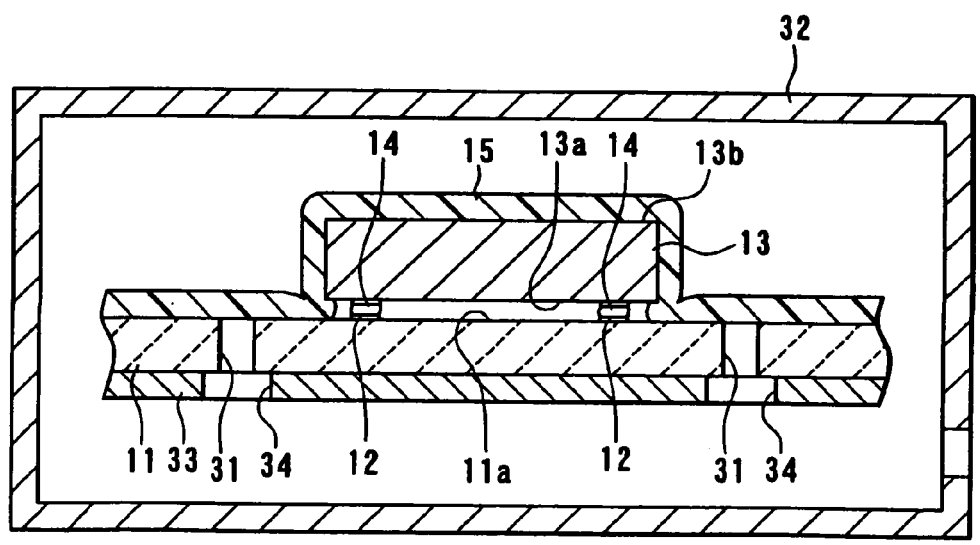
FIG. 18 is an explanatory view illustrating a step that follows FIG. 17.

Then, as shown in FIG. 18, the mount substrate 11 and the resin film 15 are heated with the heater 33 of the heating furnace 32 to a temperature at which the resin film 15 hardens or higher. This causes the resin film 15 to become fluidized, and thereafter hardened. The resin film 15 is then adhered to the mount substrate 11 and fixed in shape.

Figure 19:
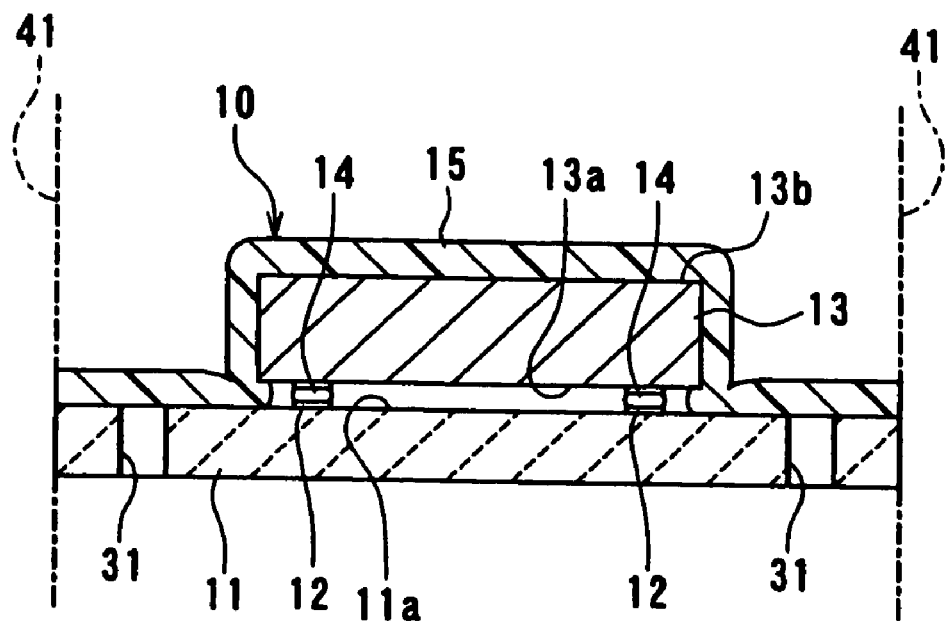
FIG. 19 is an explanatory view illustrating a step that follows FIG. 18.

Then, as shown in FIG. 19, the mount substrate 11 and the resin film 15 are cut at the positions indicated by reference numeral 41, thereby providing completed individual electronic devices 10. In this embodiment, the holes 31 in the mount substrate 11 are closed with the resin film 15 in the step of adhering the resin film 15 to the mount substrate 11, and therefore the state of sealing is maintained with reliability, without using the plug member 35 as used in the first embodiment for closing the holes 31.

In FIG. 19, the mount substrate 11 and the resin film 15 are cut such that holes 31 remain in the mount substrate 11 for each electronic device 10. However, the mount substrate 11 and the resin film 15 may be cut at positions closer to the electronic component 13 than the holes 31 are, such that none of the holes 31 remain in the mount substrate 11 for each electronic device 10.

Figure 20:
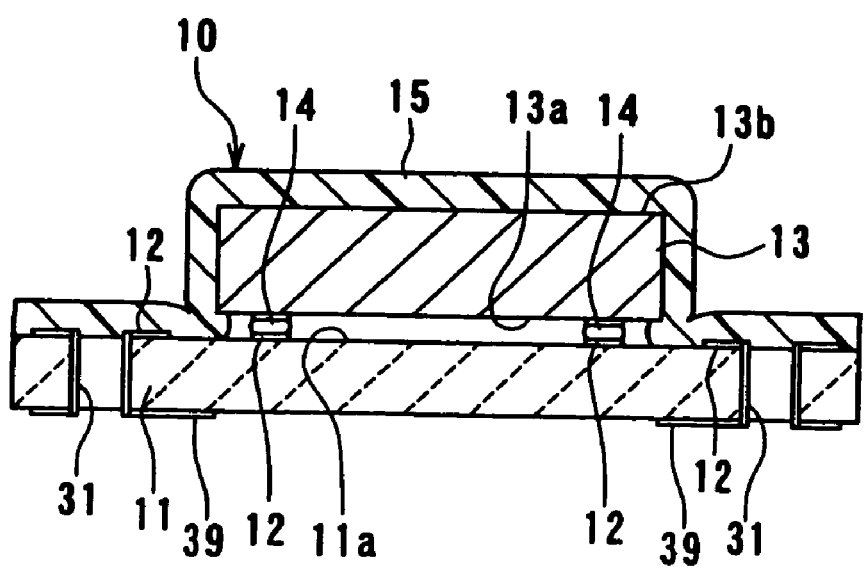
FIG. 20 is a cross-sectional view illustrating the electronic device according to the second embodiment of the invention, where a through hole is employed as a hole for sucking.

In this embodiment, the holes 31 in the mount substrate 11 are not limited to ones that are specially provided for the sucking, but may be existing holes such as through holes. FIG. 20 is a cross-sectional view illustrating the electronic device 10 according to this embodiment where through holes are employed as the holes 31. In the electronic device 10 shown in FIG. 20, the through holes acting as the holes 31 electrically connect the patterned conductors 12 disposed on the surface 11a of the mount substrate 11 and conductors 39 disposed on the other surface of the mount substrate 11. When the through holes are used as the holes 31, it is not necessary to provide any special holes for the sucking in the mount substrate 11.

The remainder of the configuration, functions and effects of this embodiment are similar to those of the first embodiment.

[Third Embodiment]

Reference is now made to FIG. 21 to FIG. 25 to describe a method of manufacturing an electronic device according to a third embodiment of the invention. The configuration of the electronic device according to this embodiment is the same as that of the first or second embodiment.

The method of manufacturing the electronic device 10 according to this embodiment includes the step of predetermining the relationship between processing conditions employed in the step of adhering the resin film 15 to the mount substrate 11 (hereinafter referred to as the adhering step) and a change in characteristics of the electronic component 13 between before and after the adhering step. In this embodiment, in the adhering step the processing conditions are controlled based on the aforementioned relationship so as to attain desired characteristics of the electronic component 13. The processing conditions may include at least one of a temperature of the resin film 15 as heated and a period of time over which the resin film 15 is heated. The resin film 15 may contain a hardening accelerator, and the processing conditions may also include the content of the hardening accelerator. The other steps in the method of manufacturing the electronic device 10 of this embodiment are the same as those of the first or second embodiment.

This embodiment is more detailed below with reference to an example in which the electronic component 13 is a surface acoustic wave device and the electronic device 10 is a band pass filter. In this case, the characteristics of the surface acoustic wave device acting as the electronic component 13 are reflected upon those of the band pass filter acting as the electronic device 10 such as the center frequency and the insertion loss in the pass band of the band pass filter. In this context, the following explanations employ the center frequency and the insertion loss in the pass band of the band pass filter to represent the characteristics of the electronic component 13.

In this example, before actually making the electronic device 10 as a product, predetermined is the relationship between the processing conditions for the adhering step and a change in the characteristic of the electronic component 13 between before and after the adhering step.

Figure 21:
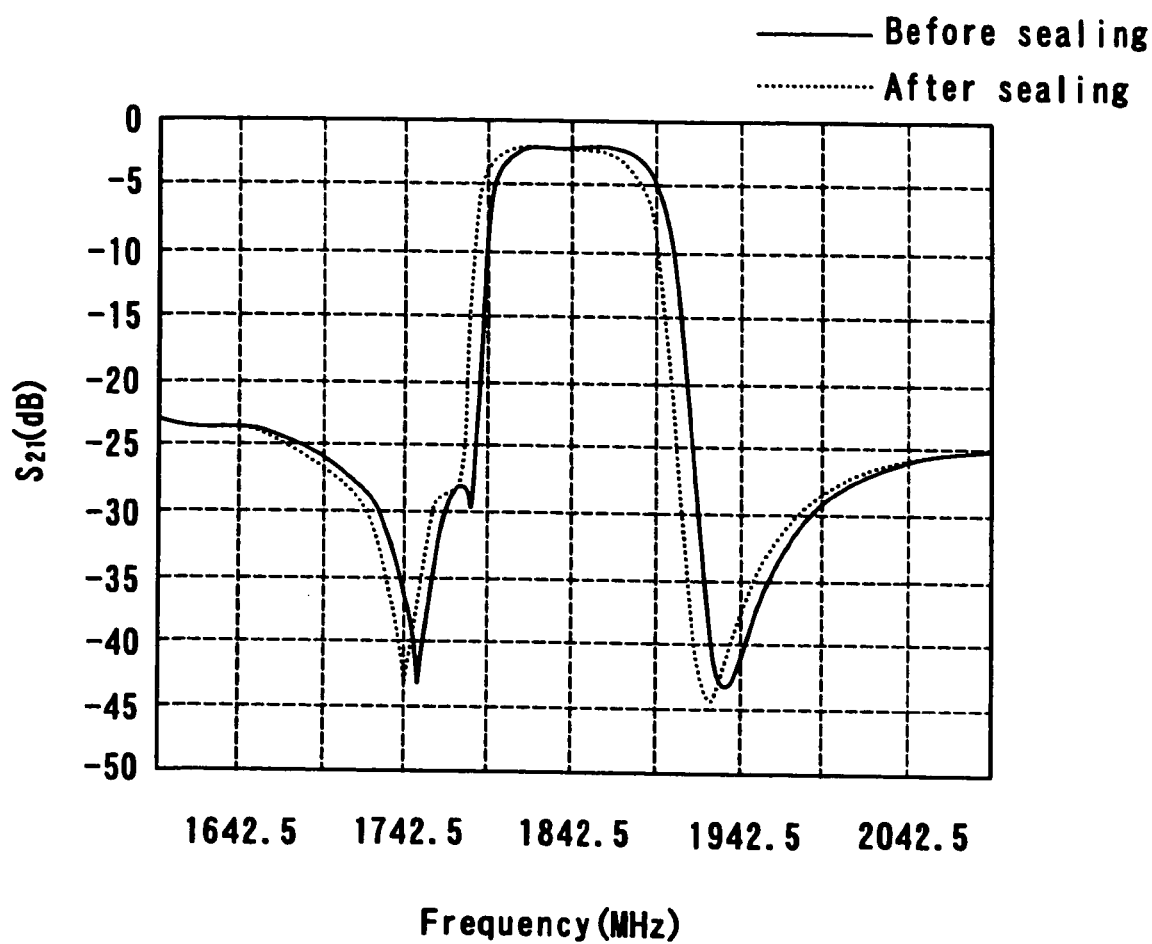
FIG. 21 is a characteristic diagram illustrating an example of transmission characteristics of a band pass filter in a third embodiment of the invention.

FIG. 21 is a characteristic diagram illustrating an example of the results of measurements conducted to determine the relationship between the aforementioned processing conditions and change in the characteristics. FIG. 21 shows a change in the transmission characteristics of the band pass filter between before and after the adhering step. In FIG. 21, the horizontal axis represents frequency and the vertical axis represents $S_{21}$ parameter corresponding to the attenuation amount of the filter. In FIG. 21, the solid line indicates the transmission characteristics obtained before the electronic component 13 is sealed, that is, before the adhering step. On the other hand, the dotted line indicates the transmission characteristics obtained after the electronic component 13 has been sealed, that is, after the adhering step. In this example, the resin film 15 is formed of an epoxy-based resin, and the content of a hardening accelerator in the epoxy-based resin is 0.1 wt %. In this example, in the adhering step the resin film 15 is heated at 180° C. for one hour. From FIG. 21, it can be seen that the center frequency in the pass band of the band pass filter changes between before and after the adhering step.

Figure 22:
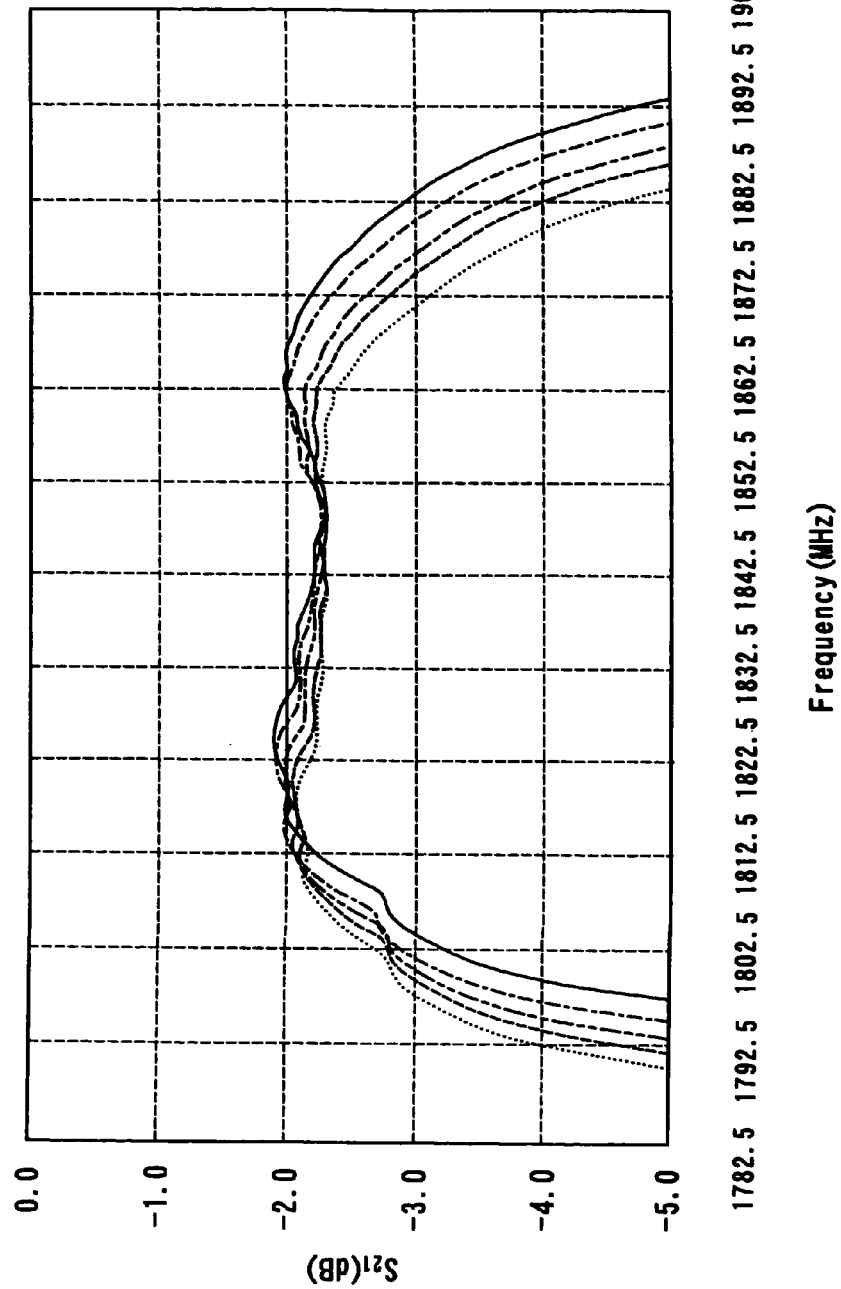
FIG. 22 is a characteristic diagram illustrating another example of the transmission characteristics of the band pass filter in the third embodiment of the invention.

FIG. 22 is a characteristic diagram illustrating another example of the results of measurements conducted to determine the relationship between the processing conditions for the adhering step and change in the characteristics of the electronic component 13 between before and after the adhering step. FIG. 22 shows changes in the transmission characteristics of the band pass filter between before and after the adhering step. In FIG. 22, the horizontal axis represents frequency and the vertical axis represents $S_{21}$ parameter. FIG. 22 shows in detail the transmission characteristics in the frequency range where the $S_{21}$ parameter has values from 0.0 to −5.0 dB. In this example, the adhering step was carried out under four different conditions, that is, by varying the number of times of the heat treatment, to measure the transmission characteristics of the band pass filter after the adhering step each time. At each heat treatment, the resin film 15 was heated at 180° C. for one hour. In this example, the resin film 15 is formed of an epoxy-based resin, and the content of a hardening accelerator in the epoxy-based resin is 0.1 wt %. In FIG. 22, the solid line indicates the transmission characteristics obtained before the electronic component 13 is sealed, that is, before the adhering step. On the other hand, the alternate long and short dashed lines indicate the transmission characteristics obtained after the adhering step in which the heat treatment was performed once. The chain double-dashed line indicates the transmission characteristics obtained after the adhering step in which the heat treatment was performed twice. The dashed line indicates the transmission characteristics obtained after the adhering step in which the heat treatment was performed three times. The dotted line indicates the transmission characteristics after the adhering step in which the heat treatment was performed four times. In the example shown in FIG. 22, the larger the number of times of the heat treatment in the adhering step, the greater the amount of change in the center frequency in the pass band of the band pass filter between before and after the adhering step.

Figure 23:
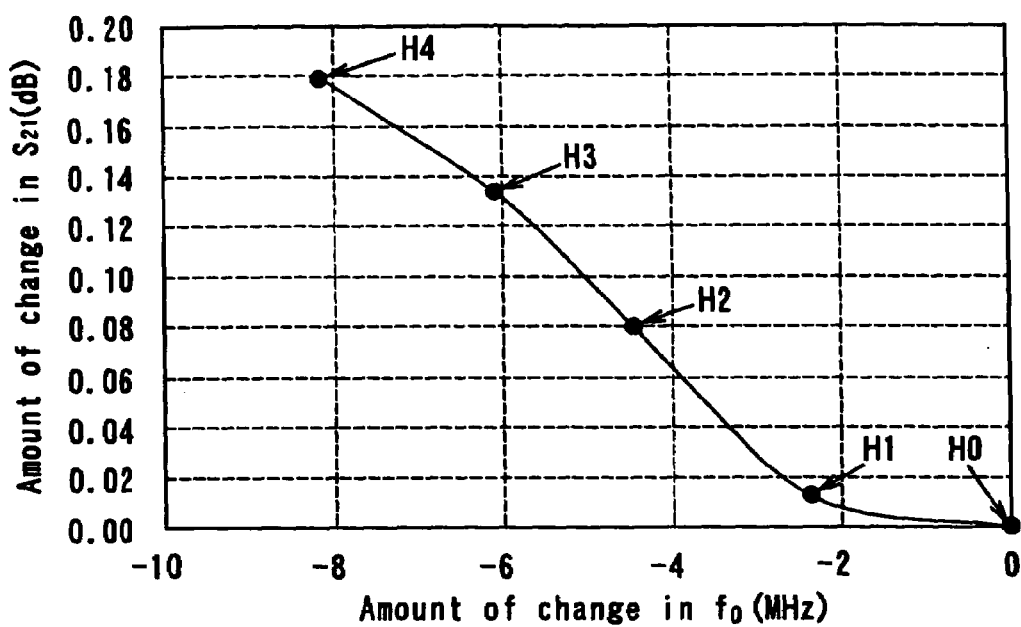
FIG. 23 is a characteristic diagram illustrating the relationship among the number of times of heat treatment, the amount of change in center frequency, and the amount of change in $S_{21}$ parameter in the third embodiment of the invention.

In this example, from the results shown in FIG. 22, determined was the relationship among the number of times of the heat treatment in the adhering step, the amount of change in the center frequency $f_0$ in the pass band of the band pass filter between before and after the adhering step, and the amount of change in the $S_{21}$ parameter of the band pass filter between before and after the adhering step. FIG. 23 is a characteristic diagram illustrating the relationship. In FIG. 23, the horizontal axis represents the amount of change in the center frequency $f_0$ and the vertical axis represents the amount of change in the $S_{21}$ parameter. Furthermore, in FIG. 23, the point indicated by symbol H0 corresponds to the origin of FIG. 23, that is, to the center frequency $f_0$ and the $S_{21}$ parameter provided before the electronic component 13 is sealed. The point indicated by symbol H1 represents the amounts of changes in the center frequency $f_0$ and in the $S_{21}$ parameter between before and after the adhering step in which the heat treatment was performed once. The point indicated by symbol H2 represents the amounts of changes in the center frequency $f_0$ and in the $S_{21}$ parameter between before and after the adhering step in which the heat treatment was performed twice. The point indicated by symbol H3 represents the amounts of changes in the center frequency $f_0$ and in the $S_{21}$ parameter between before and after the adhering step in which the heat treatment was performed three times. The point indicated by symbol H4 represents the amounts of changes in the center frequency $f_0$ and in the $S_{21}$ parameter between before and after the adhering step in which the heat treatment was performed four times. In this example, the pass band is defined as the frequency band between the two frequencies at which the $S_{21}$ parameter takes on a value lower than that at the minimum insertion loss by 3 dB, and the center frequency is defined to be the center frequency of this pass band.

From FIG. 23, it can be seen that both the amount of change in the center frequency $f_0$ and the amount of change in the $S_{21}$ parameter between before and after the adhering step increase with an increase in the number of times of the heat treatment performed in the adhering step, that is, with an increase in the time period of the heating. In the example shown in FIG. 23, the center frequency $f_0$ shifts by about 2 MHz with one additional number of times of the heat treatment in the adhering step.

FIG. 23 shows the relationship among the number of times of the heat treatment of the resin film 15 serving as the processing condition employed in the adhering step, and the amounts of changes in the center frequency $f_0$ and in the $S_{21}$ parameter indicating changes in the characteristics of the electronic component 13 between before and after the adhering step.

Figure 24:
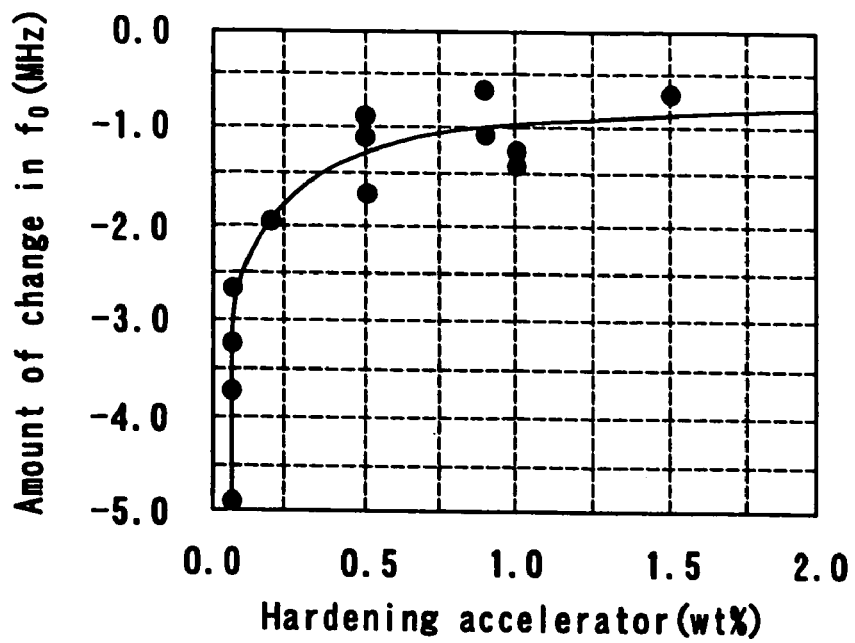
FIG. 24 is a characteristic diagram illustrating the relationship between the content of a hardening accelerator and the amount of change in center frequency in the third embodiment of the invention.

FIG. 24 is a characteristic diagram illustrating still another example of the results of measurements conducted to determine the relationship between the processing conditions employed in the adhering step and change in the characteristics of the electronic component 13 between before and after the adhering step. In the measurements, determined was the relationship between the content of the hardening accelerator in the resin film 15 formed of an epoxy-based resin and the amount of change in the center frequency $f_0$ between before and after the adhering step. Here, in the adhering step the resin film 15 was heated at 150° C. for one hour. In FIG. 24, the horizontal axis represents the content of the hardening accelerator and the vertical axis represents the amount of change in the center frequency $f_0$. In FIG. 24, the black dots represent actual values of the measurements. The solid line represents the relationship between the content of the hardening accelerator and the amount of change in the center frequency $f_0$, determined by the least square method based on the measurements. From FIG. 24, it can be seen that the amount of change in the center frequency $f_0$ varies depending on the content of the hardening accelerator. Thus, FIG. 24 shows the relationship between the content of the hardening accelerator serving as the processing condition in the adhering step and the amount of change in the center frequency $f_0$ indicating a change in the characteristics of the electronic component 13 between before and after the adhering step.

Figure 25:
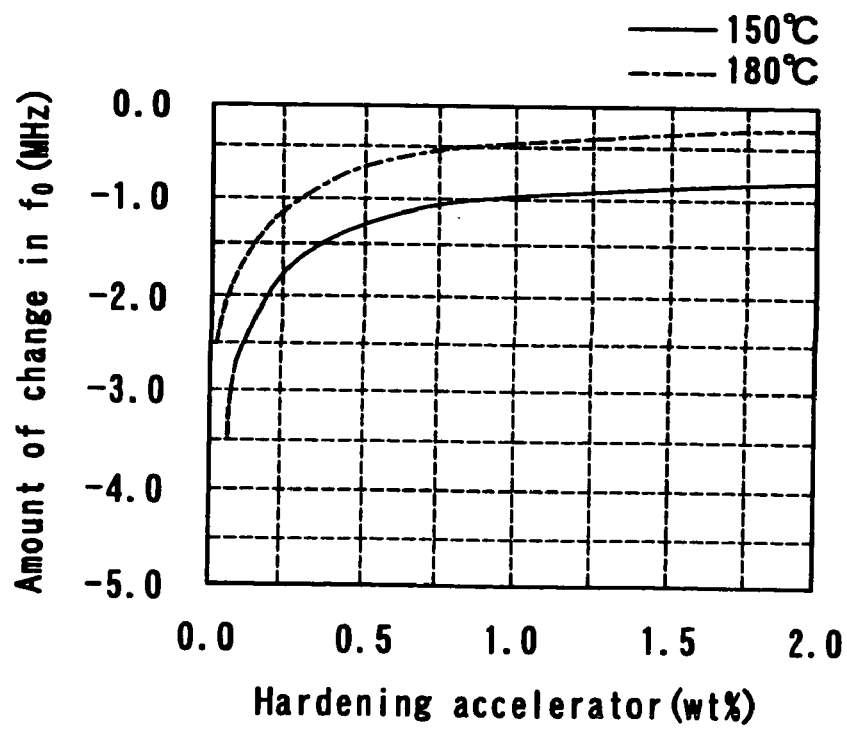
FIG. 25 is a characteristic diagram illustrating the relationship among the content of the hardening accelerator and temperature at which the resin film is heated, and the amount of change in center frequency in the third embodiment of the invention.

FIG. 25 is a characteristic diagram illustrating still another example of the results of measurements conducted to determine the relationship between the processing conditions employed in the adhering step and change in the characteristics of the electronic component 13 between before and after the adhering step. The measurements were conducted to determine the relationships between the content of the hardening accelerator in the resin film 15 formed of an epoxy-based resin and the amount of change in the center frequency $f_0$ between before and after the adhering step in the cases where the resin film 15 was heated at 150° C. and at 180° C. in the adhering step. The other conditions for the measurements were the same as those for the measurements shown in FIG. 24. The curves in FIG. 25 represent the relationships between the content of the hardening accelerator and the amount of change in the center frequency $f_0$, determined by the least square method based on the measurements. From FIG. 25, it can be seen that the amount of change in the center frequency $f_0$ varies depending on the content of the hardening accelerator and the temperature at which the resin film 15 is heated in the adhering step. Thus, FIG. 25 shows the relationship among the content of the hardening accelerator and the temperature at which the resin film 15 is heated, which serve as the processing conditions in the adhering step, and the amount of change in the center frequency $f_0$ indicating a change in the characteristics of the electronic component 13 between before and after the adhering step.

In this embodiment, the electronic device 10 is manufactured through controlling the processing conditions in the adhering step based on the relationships determined as described above, so as to attain desired characteristics of the electronic component 13. More specifically, in this embodiment, the following two methods are available for attaining desired characteristics of the electronic component 13 in manufacturing the electronic device 10.

A first method is to compensate the characteristics of the electronic component 13 through controlling the processing conditions in the adhering step in manufacturing the electronic device 10. For example, this method is accomplished as follows. First, before the electronic component 13 is mounted on the mount substrate 11, the center frequency in the pass band of the band pass filter, serving as an indicator of the characteristics of the electronic component 13, is measured. If the measured center frequency is shifted from a desired frequency and the shift falls within a range that can be compensated by controlling the processing conditions in the adhering step, the shift in the center frequency is compensated by controlling the processing conditions in the adhering step. This makes it possible to bring the center frequency in the pass band of the band pass filter closer to the desired frequency.

According to a second method, in manufacturing the electronic device 10, the electronic component 13 is fabricated in expectation of a change in the characteristics of the electronic component 13 between before and after the adhering step, so as to attain desired characteristics of the electronic component 13 after the adhering step. For example, this method is accomplished as follows. First, the processing conditions to be employed in the adhering step are determined such that the amount of change in the center frequency between before and after the adhering step will fall within a predetermined amount. Then, in expectation of the change in the center frequency between before and after the adhering step, the electronic component 13 is fabricated so as to obtain a desired center frequency after the adhering step. This means that the electronic component 13 is fabricated such that the center frequency shifts from the desired frequency by the predetermined amount. The adhering step is then carried out under the predetermined conditions, thereby attaining a center frequency closer to the desired frequency.

In either of the first and second methods, if the amount of change in the $S_{21}$ parameter increases with an increase in the amount of change in the center frequency as shown in FIG. 23, thereby increasing the insertion loss, it is preferable to control the processing conditions such that the amount of change in the $S_{21}$ parameter will fall within a range less than or equal to a predetermined amount (e.g., 0.05 dB).

As described above, according to this embodiment it is possible to attain desired characteristics of the electronic component 13 while adhering the resin film 15 to the mount substrate 11 by heating the resin film 15.

The remainder of the configuration, functions and effects of this embodiment are similar to those of the first or second embodiment.

The invention is not limited to the aforementioned embodiments but may be modified in a variety of ways. For example, in the invention, one electronic device may include a plurality of electronic components.

As described above, in the method of manufacturing the electronic device of the invention, the resin film is placed over the electronic component and the mount substrate, and, the gas existing on the electronic-component side of the mount substrate is sucked from the other side of the mount substrate through the hole provided in the mount substrate. The resin film is thereby deformed to cover the electronic component and the mount substrate in close contact with the surface of the electronic component farther from the mount substrate and with the part of the one of the surfaces of the mount substrate located around the electronic component. Furthermore, the resin film is heated to be fluidized, and thereafter to be hardened. The resin film is then adhered to the mount substrate. The resin film reinforces the mechanical bonding between the connection electrode of the electronic component and the patterned conductor of the mount substrate. The invention thus makes it possible to improve the strength and stability of the mechanical bonding between the connection electrode of the electronic component and the patterned conductor of the mount substrate, through simple steps and without adversely affecting the operation of the electronic component.

In the method of manufacturing the electronic device of the invention, the resin film is deformed by sucking the gas existing on the electronic-component side of the mount substrate from the other side of the mount substrate through the hole formed in the mount substrate. Therefore, according to the invention it is easy to define the shape of the resin film.

In the method of manufacturing the electronic device of the invention, the resin film is brought into close contact with the electronic component and the mount substrate by sucking the gas as described above, and the resin film is then heated to cause the resin film to fluidize, and thereafter to harden. The resin film is then adhered to the mount substrate. Therefore, according to the invention the resin film comes into highly close contact with the electronic component and the mount substrate, and as a result, the strength and stability of the mechanical bonding between the connection electrode of the electronic component and the patterned conductor of the mount substrate are improved with higher reliability.

In the method of manufacturing the electronic device of the invention, the electronic component may be sealed with the resin film. This makes it possible to seal the electronic component through simple steps, without adversely affecting the operation of the electronic component.

In the method of manufacturing the electronic device of the invention, a cavity may be formed between the one of the surfaces of the electronic component and the one of the surfaces of the mount substrate. In this case, it is possible to prevent the one of the surfaces of the electronic component from contacting other components or foreign materials, which can consequently eliminate possible adverse effects on the operation of the electronic device.

In the method of manufacturing the electronic device of the invention, the resin film may be deformed with the resin film softened in the step of deforming the resin film. In this case, the shape of the resin film is defined more easily.

In the method of manufacturing the electronic device of the invention, the hole formed in the mount substrate may be disposed at a center portion of a region of the mount substrate where the electronic component is placed, and the hole may be closed after the step of adhering the resin film. In this case, when the electronic component is sealed with the resin film, it is possible to maintain the sealed state of the electronic component with reliability.

In the method of manufacturing the electronic device of the invention, the hole formed in the mount substrate may be disposed around a region of the mount substrate where the electronic component is placed, and the hole may be closed with the resin film in the step of adhering the resin film. In this case, when the electronic component is sealed with the resin film, it is possible to maintain the sealed state of the electronic component with reliability.

In the method of manufacturing the electronic device of the invention, the hole formed in the mount substrate may be a through hole for electrically connecting the patterned conductor disposed on the one of the surfaces of the mount substrate and another conductor provided in the mount substrate. In this case, it is not necessary to provide the mount substrate with any special hole for sucking.

The method of manufacturing the electronic device of the invention may further comprise the step of predetermining a relationship between a processing condition employed in the step of adhering the resin film and a change in characteristics of the electronic component between before and after the step of adhering the resin film, and, in the step of adhering the resin film, the processing condition may be controlled based on the relationship mentioned above, so as to obtain desired characteristics of the electronic component. In this case, it is possible to attain desired characteristics of the electronic component while adhering the resin film to the mount substrate by heating the resin film.

In the electronic device of the invention, the resin film is adhered to the mount substrate, covering the electronic component and the mount substrate in close contact with the surface of the electronic component farther from the mount substrate and with the part of the one of the surfaces of the mount substrate located around the electronic component. The resin film acts to reinforce the mechanical bonding between the connection electrode of the electronic component and the patterned conductor of the mount substrate. Accordingly, the invention makes it possible to improve the strength and stability of the mechanical bonding between the connection electrode of the electronic component and the patterned conductor of the mount substrate, with a simple configuration and without adversely affecting the operation of the electronic component.

The electronic device of the invention makes it possible, in the manufacturing process thereof, to deform the resin film by sucking a gas existing on the electronic-component side of the mount substrate from the other side of the mount substrate through the hole formed in the mount substrate. Therefore, according to the invention it is easy to define the shape of the resin film.

In the electronic device of the invention, the resin film is brought into close contact with the electronic component and the mount substrate through the suction of the gas as described above, and is adhered to the mount substrate after being fluidized and thereafter hardened by heating. Therefore, according to the invention the resin film comes into highly close contact with the electronic component and the mount substrate, and as a result, the strength and stability of the mechanical bonding between the connection electrode of the electronic component and the patterned conductor of the mount substrate are improved with higher reliability.

In the electronic device of the invention, the electronic component may be sealed with the resin film. In this case, sealing of the electronic component is effected with a simple configuration and without adversely affecting the operation of the electronic component.

In the electronic device of the invention, a cavity may be formed between the one of the surfaces of the electronic component and the one of the surfaces of the mount substrate. In this case, it is possible to prevent the one of the surfaces of the electronic component from contacting other components or foreign materials, which can consequently eliminate possible adverse effects on the operation of the electronic device.

In the electronic device of the invention, the hole formed in the mount substrate may be disposed at a center portion of a region of the mount substrate where the electronic component is placed, and the hole may be closed with a plug member. In this case, when the electronic component is sealed with the resin film, it is possible to maintain the sealed state of the electronic component with reliability.

In the electronic device of the invention, the hole formed in the mount substrate may be disposed around a region of the mount substrate where the electronic component is placed, and the hole may be closed with the resin film. In this case, when the electronic component is sealed with the resin film, it is possible to maintain the sealed state of the electronic component with reliability.

In the electronic device of the invention, the hole formed in the mount substrate may be a through hole for electrically connecting the patterned conductor disposed on the one of the surfaces of the mount substrate and another conductor provided in the mount substrate. In this case, it is not necessary to provide the mount substrate with any special hole for sucking.

Obviously many modifications and variations of the present invention are possible in the light of the above teachings. It is therefore to be understood that within the range of equivalency of the appended claims the present invention may be carried out otherwise than as specifically described.

What is claimed is:

1. A method of manufacturing an electronic device, the electronic device comprising: a mount substrate having a patterned conductor exposed on one of surfaces of the mount substrate; and an electronic component having a connection electrode formed on one of surfaces of the electronic component, the one of the surfaces of the electronic component that has the connection electrode formed thereon being disposed to face toward the one of the surfaces of the mount substrate, the connection electrode being electrically connected and mechanically bonded to the patterned conductor of the mount substrate, the method comprising the steps of:

disposing the electronic component and the mount substrate such that the one of the surfaces of the electronic component faces toward the one of the surfaces of the mount substrate, and electrically connecting and mechanically bonding the connection electrode of the electronic component to the patterned conductor of the mount substrate;

placing a resin film over the electronic component and the mount substrate;

deforming the resin film by sucking a gas existing on an electronic-component side of the mount substrate from the other side of the mount substrate through a hole provided in the mount substrate, such that the resin film covers the electronic component and the mount substrate in close contact with a surface of the electronic component that is farther from the mount substrate and with a part of the one of the surfaces of the mount substrate, the part being located around the electronic component; and adhering the resin film to the mount substrate by heating the resin film to cause the resin film to fluidize and thereafter to harden, wherein the resin film is formed of a thermosetting resin; and when the resin film hardens by being heated, the resin film contracts and thereby acts to push the electronic component toward the mount substrate.

2. A method of manufacturing an electronic device according to claim 1, wherein the resin film seals the electronic component.

3. A method of manufacturing an electronic device according to claim 1, wherein a cavity is formed between the one of the surfaces of the electronic component and the one of the surfaces of the mount substrate.

4. A method of manufacturing an electronic device according to claim 1, wherein the resin film is deformed with the resin film softened in the step of deforming the resin film.

5. A method of manufacturing an electronic device according to claim 1, wherein the hole formed in the mount substrate is disposed at a center portion of a region of the mount substrate where the electronic component is placed.

6. A method of manufacturing an electronic device according to claim 5, further comprising the step of closing the hole after the step of adhering the resin film.

7. A method of manufacturing an electronic device according to claim 1, wherein the hole formed in the mount substrate is disposed around a region of the mount substrate where the electronic component is placed, and the hole is closed with the resin film in the step of adhering the resin film.

8. A method of manufacturing an electronic device according to claim 1, wherein the hole formed in the mount substrate is a through hole for electrically connecting the patterned conductor disposed on the one of the surfaces of the mount substrate and another conductor provided in the mount substrate.

9. A method of manufacturing an electronic device according to claim 1, wherein the electronic component is a surface acoustic wave device and the electronic device is a band pass filter, the method further comprises the step of determining in advance, based on results of measurement, a relationship between a processing condition employed in the step of adhering the resin film and the amount of change in a center frequency in a pass band of the band pass filter between before and after the step of adhering the resin film, the processing condition includes at least one of a temperature of the resin film as heated and a period of time over which the resin film is heated, and in the step of adhering the resin film, the processing condition is controlled so that a desired center frequency be obtained for the band pass filter, based on the relationship determined in advance.

10. A method of manufacturing an electronic device according to claim 1, wherein the electronic component is a surface acoustic wave device and the electronic device is a band pass filter, the method further comprises the step of determining in advance, based on results of measurement, a relationship between a processing condition employed in the step of adhering the resin film and the amount of change in a center frequency in a pass band of the band pass filter between before and after the step of adhering the resin film, the resin film contains a hardening accelerator, and the processing condition includes a content of the hardening accelerator contained in the resin film, and in the step of adhering the resin film, the processing condition is controlled so that a desired center frequency be obtained for the band pass filter, based on the relationship determined in advance.

* * * * *